(12) United States Patent
Lee et al.

(10) Patent No.: US 11,930,640 B2
(45) Date of Patent: Mar. 12, 2024

(54) THREE-DIMENSIONAL SEMICONDUCTOR DEVICE HAVING A SUPPORT PATTERN IN CONTACT WITH A SIDE SURFACE OF A CONTACT PLUG

(71) Applicant: SK hynix Inc., Icheon-si (KR)

(72) Inventors: Go Hyun Lee, Icheon-si (KR); Jae Taek Kim, Icheon-si (KR); Hye Yeong Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 220 days.

(21) Appl. No.: 17/181,971

(22) Filed: Feb. 22, 2021

(65) Prior Publication Data

US 2022/0123008 A1    Apr. 21, 2022

(30) Foreign Application Priority Data

Oct. 19, 2020  (KR) .......................... 10-2020-0134946

(51) Int. Cl.
*H10B 43/40* (2023.01)
*H01L 23/00* (2006.01)
*H01L 23/522* (2006.01)
*H01L 23/535* (2006.01)
*H10B 43/27* (2023.01)

(52) U.S. Cl.
CPC ......... *H10B 43/40* (2023.02); *H01L 23/5226* (2013.01); *H01L 23/535* (2013.01); *H01L 23/562* (2013.01); *H10B 43/27* (2023.02)

(58) Field of Classification Search
CPC ........ H10B 43/27; H10B 41/27; H10B 43/35; H10B 43/10; H10B 43/50; H01L 21/76805; H01L 21/76897; H01L 23/5226; H01L 23/535
See application file for complete search history.

(56) References Cited

U.S. PATENT DOCUMENTS

| | | | |
|---|---|---|---|
| 9,853,149 B1 | 12/2017 | Chen et al. | |
| 2021/0296277 A1* | 9/2021 | Iijima | H10B 43/40 |
| 2022/0068903 A1* | 3/2022 | Kim | H10B 43/40 |

FOREIGN PATENT DOCUMENTS

KR    1020180102727 A    9/2018

* cited by examiner

*Primary Examiner* — Tony Tran

(57) ABSTRACT

The semiconductor device includes a substrate having a cell area and a via area; a transistor and a logic interconnection disposed over the substrate; a lower insulating layer covering the transistor and the logic interconnection; a lower conductive layer on the lower insulating layer in the cell area; a support pattern disposed on the lower insulating layer in the via area; a lower via plug having a side surface in contact with the support pattern and a bottom surface in contact with the logic interconnection; a word line stack disposed on the lower conductive layer in the cell area; an dielectric layer stack disposed on the support pattern in the via area; a vertical channel pillar penetrating the word line stack to be connected to the lower conductive layer; and an upper via plug penetrating the dielectric layer stack to be vertically aligned with the lower via plug.

14 Claims, 33 Drawing Sheets

THREE-DIMENSIONAL SEMICONDUCTOR DEVICE HAVING A SUPPORT PATTERN IN CONTACT WITH A SIDE SURFACE OF A CONTACT PLUG

CROSS-REFERENCE TO RELATED APPLICATION

This application claims priority under 35 U.S.C. § 119(a) to Korean Patent Application No. 10-2020-0134946 filed on Oct. 19, 2020, which is incorporated herein by reference in its entirety.

BACKGROUND

1. Technical Field

The present disclosure relates to a semiconductor device, and more particularly, to a three-dimensional (3D) semiconductor device having a support pattern in contact with a side surface of a contact plug.

2. Related Art

As the degree of integration of semiconductor devices increases, pitches and spaces between interconnections and contact plugs are greatly reduced. In particularly, technical problems have emerged for vertically aligning fine contact plugs with a large aspect ratio. In addition, as several CMP (Chemical Mechanical Polishing) processes are performed, problems with flatness, such as dishing, affects alignment between contact plugs.

SUMMARY

Embodiments of the present disclosure provide a semiconductor device including support patterns that mitigate dishing and improve alignment margins between contact plugs.

Embodiments of the present disclosure provide various systems including a semiconductor device including support patterns that mitigate dishing and improve alignment margins between contact plugs.

Embodiments of the present disclosure provide methods of manufacturing semiconductor devices including support patterns that alleviate a dishing phenomenon and improve an alignment margin between contact plugs.

A semiconductor device according to an embodiment of the resent disclosure may include a substrate having a cell area and a via area; a transistor and a logic interconnection disposed over the substrate; a lower insulating layer covering the transistor and the logic interconnection; a lower conductive layer on the lower insulating layer in the cell area; a support pattern disposed on the lower insulating layer in the via area; a lower via plug having a side surface in contact with the support pattern and a bottom surface in contact with the logic interconnection in the via area; a word line stack disposed on the lower conductive layer in the cell area; an dielectric layer stack disposed on the support pattern and the lower insulating layer in the via area; a vertical channel pillar penetrating the word line stack to be connected to the lower conductive layer in the cell area; and an upper via plug penetrating the dielectric layer stack to be aligned in a vertical direction with the lower via plug in the via area.

A semiconductor device according to an embodiment of the resent disclosure may include a logic device layer and a memory device layer stacked on the logic device layer. The logic device layer may include a substrate having a cell area and a via area; a logic interconnection disposed over the substrate; a lower conductive layer disposed over the logic interconnection in the cell area; a lower via plug in contact with the logic interconnection in the via area; and a support pattern in contact with a side surface of the lower via plug in the via area. The memory device layer may include a word line stack disposed on the lower conductive layer in the cell area, the word line stack including first insulating layers and word lines alternately stacked; vertical channel pillars penetrating the word line stack in a vertical direction to be connected to the lower conductive layer in the cell area; a dielectric layer stack in the via area; an upper peripheral contact plug vertically penetrating the dielectric layer stack to be vertically aligned with the lower via plug in the via area. Top surfaces of the lower via plug and the support pattern are co-planar. The lower via plug has a height greater than that of the support pattern in the vertical direction.

A semiconductor device according to an embodiment of the resent disclosure may include a substrate having a cell area, an extension area, and a via area; a transistor and a logic interconnection disposed over the substrate; a lower conductive layer disposed over the transistor and a logic interconnection in the cell area and the extension area; a support pattern and a lower via plug disposed on the lower insulating layer in the via area; a word line stack disposed on the lower conductive layer in the cell area and the extension area; a vertical channel pillar vertically penetrating the word line stack to be connected to the lower conductive layer in the cell area; word line contact plugs electrically connected to the word lines of the word line stack in the extension area, respectively; an dielectric layer stack disposed on the support pattern, the lower via plug and the lower insulating layer in the via area; and an upper via plug vertically penetrating the dielectric layer stack to be vertically aligned with the lower via plug. A side surface of the support pattern and a side surface of the lower via plug may be in contact with each other.

DETAILED DESCRIPTION

Figure 1A:
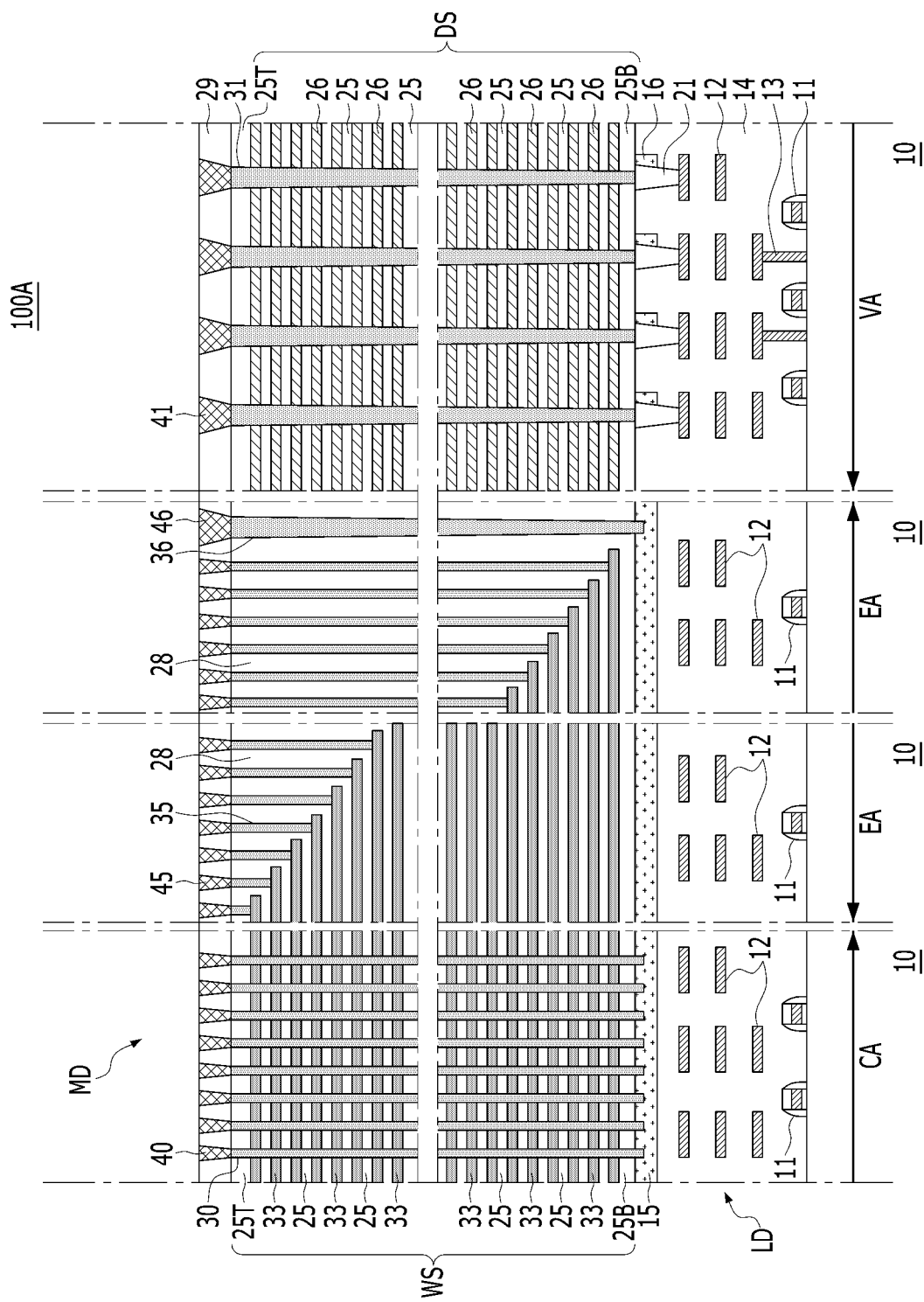
FIG. 1A is a schematic longitudinal cross-sectional view illustrating a three-dimensional (3D) semiconductor device in accordance with an embodiment of the present disclosure.

Various examples and embodiments of the disclosed technology are described below in detail with reference to the accompanying drawings. The drawings might not be necessarily to scale, and in some instances, proportions of at least some structures in the drawings may be exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and different relative positioning relationships or sequences of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, however, a multi-layer structure where one or more other intermediate layers exist between the first layer and the second layer or the substrate may be included in other embodiments or examples.

FIG. 1A is a schematic longitudinal cross-sectional view illustrating a 3D semiconductor device in accordance with an embodiment of the present disclosure. Referring to FIG. 1A, a 3D semiconductor device 100A in accordance with an embodiment of the present disclosure may include a logic device layer LD and a memory device layer MD stacked on the logic device layer LD. The logic device layer LD, the memory device layer MD, and a substrate 10 of the 3D semiconductor device 100A may be organized into a cell area CA, an extension area EA, and a via area VA.

The logic device layer LD may include logic circuit components 11 to 13, a lower insulating layer 14, a lower conductive layer 15, support patterns 16, and lower via plugs 21 disposed on a substrate 10. The logic circuit components 11 to 13 may include MOS transistors 11, logic interconnections 12, and logic via plugs 13. The logic interconnections 12 may include a conductor and may transmit an electrical signal in a horizontal direction. The logic interconnections 12 may be formed and disposed in multiple conductive layers. The logic via plugs 13 may include a conductor and may transmit an electrical signal in a vertical direction. The lower insulating layer 14 may cover and surround the MOS transistors 11, the logic interconnections 12, and the logic via plugs 13. The lower insulating layer 14 may include an insulating material such as silicon oxide.

The lower conductive layer 15 may be disposed at an upper portion of the cell area CA of the logic device layer LD. For example, the lower conductive layer 15 may be buried in the lower insulating layer 14. In a top view, the lower conductive layer 15 may have a plate shape that occupies most of the cell area CA. The lower conductive layer 15 may also be disposed on the extension area EA of the logic device layer LD. The lower conductive layer 15 may be a common source region. For example, the lower conductive layer 15 may include polysilicon doped with N-type ions. In one embodiment, the lower conductive layer 15 may include at least one of a metal such as tungsten (W), a metal silicide such as titanium silicide (TiSi), or a metal compound such as titanium nitride (TiN).

The support patterns 16 may have the same material and the same vertical thickness as the lower conductive layer 15. The lower via plugs 21 may include at least one of a metal such as tungsten (W), a metal compound such as titanium nitride, or a conductor such as polysilicon doped with N-type ions.

A side surface of a lower via plug 21 may be in contact with a support pattern 16. Accordingly, the lower via plugs 21 in contact with the support patterns 16 may be electrically connected to the support patterns 16. Bottom surfaces of the lower via plugs 21 may be in contact with some of the logic interconnections 12 disposed at a top layer or the uppermost level. Accordingly, the lower via plugs 21 may be directly electrically connected to some of the logic interconnections 12. Top surfaces of the support patterns 16 and of the lower via plugs 21 may be coplanar. The lower via plugs 21 may have a greater vertical thickness or a vertical height than that of the support patterns 16. Bottom surfaces of the lower via plugs 21 may be located at a lower level than that of bottom surfaces of the support patterns 16.

The memory device layer MD may include a word line stack WS, a dielectric layer stack DS, vertical channel pillars 30, vertical channel studs 40, word line contact plugs 35, word line contact studs 45, a through via plug 36, a through via stud 46, upper via plugs 31, and via studs 41.

The word line stack WS may include first insulating layers 25, 25B, and 25T, and word lines 33. The first insulating layers 25, 25B, and 25T may be alternately stacked with the word lines 33. The word line stack WS may extend from the cell area CA to the extension area EA.

The dielectric layer stack DS may include first insulating layers 25 and second insulating layers 26, which are alternately stacked. The dielectric layer stack DS may be disposed only in the via area VA.

The first insulating layers 25 may include silicon oxide. The lowermost first insulating layer 25B may insulate the word lines 33 and the lower conductive layer 15. The intermediate first insulating layers 25 may insulate the word lines 33. The uppermost first insulating layer 25T may insulate the word lines 33 and the vertical channel studs 40.

The second insulating layers 26 may include silicon nitride. The second insulating layers 26 may be disposed at the same level, in a vertical direction, as the word lines 33, respectively.

In the extension area EA, the word lines 33 may form a staircase. An intermediate insulating layer 28 may cover the staircase word lines 33. The intermediate insulating layer 28 may include the same material as the first insulating layer 25.

The vertical channel pillars 30 may vertically penetrate the word line stack WS to electrically connect the lower conductive layer 15 to the vertical channel stud 40. Lower ends of the vertical channel pillars 30 may protrude into the lower conductive layer 15. The vertical channel pillars 30 may include a core insulating layer at the center, a channel layer surrounding side surfaces of the core insulating layer, and a memory layer surrounding the channel layer. The memory layer may include a tunneling insulating layer, a charge storage layer, and a blocking insulating layer. The core insulating layer and the tunneling insulating layer may include silicon oxide, the charge storage layer may include silicon nitride or a high-k dielectric material, and the blocking insulating layer may include a metal oxide. In one embodiment, the memory layer may further include a barrier metal layer such as titanium nitride (TiN) between the vertical channel pillars 30 and the word lines 33.

The word line contact plugs 35 vertically penetrate the intermediate insulating layer 28 in the extension area EA to exclusively contact end portions of the staircase word lines 33, respectively. The through via plug 36 may vertically penetrate the intermediate insulating layer 28 to be connected to the lower conductive layer 15 in the extension area EA. The through via plug 36 may be electrically insulated from the word line contact plugs 35, without contacting the word line contact plugs 35. The through via plug 36 may not be electrically connected to the word lines 33, and may be electrically insulated from the word lines 33. For example, the through via plug 36 may not vertically penetrate the word lines 33. That is, the through via plug 36 may be horizontally spaced apart from the word lines 33.

The upper via plugs 31 may vertically penetrate the dielectric layer stack DS to be connected to the lower via plugs 21 in the via region VA, respectively. That is, the upper via plugs 31 may be vertically aligned with the lower via plugs 21, respectively.

The word line contact plugs 35, the through via plug 36, and the upper via plugs 31 may include a conductor such as polysilicon doped with N-type ions, metal, metal silicide, or metal compound.

The vertical channel studs 40 may electrically connect the vertical channel pillars 30 to upper interconnections (not shown), respectively. The word line contact studs 45 may electrically connect the word line contact plugs 35 to the upper interconnections, respectively. The through via stud 46 may electrically connect the through via plug 36 to the upper interconnections. The via studs 41 may electrically connect the upper via plugs 31 to the upper interconnections. The vertical channel studs 40, the word line contact studs 45, the through via stud 46, and the via studs 41 may be surrounded by an upper insulating layer 29, which may be disposed on the uppermost interlayer insulating layer 25T. The vertical channel studs 40, the word line contact studs 45, the through via stud 46, and the via studs 41 may include a conductor such as polysilicon doped with N-type ions, a metal, a metal silicide, or a metal compound. The upper insulating layer 29 may include an insulating material such as silicon oxide.

Figure 1B:
FIG. 1B is a layout illustrating alignments of lower via plugs, upper via plugs, and support patterns of a 3D semiconductor device illustrated in FIG. 1A in accordance with an embodiment of the present disclosure.

FIG. 1B is a layout illustrating alignments of lower via plugs, upper via plugs, and support patterns of a 3D semiconductor device illustrated in FIG. 1A in accordance with an embodiment of the present disclosure. In an embodiment, it is assumed that each of lower via plugs 21 has a smooth rectangular cross section, and that each of upper via plugs 31 has a circular cross section so that the technical concepts of the present disclosure can be easily understood. In other embodiments, however, such structures may have different cross sectional shapes. For example, the lower via plugs 21 may have a circular cross section. In FIG. 1B, the lower via plugs 21 and the upper via plugs 31 are considered to be in good alignment. That is, it is assumed that the lower ends of the upper via plugs 31 completely overlap the upper surfaces of the lower via plugs 21. Referring to FIG. 1B, each of support patterns 16 may be disposed to abut one side surface of each of the lower via plugs 21. As shown in FIG. 1B, the length of the support patterns 16 may be greater than the length of one side of the lower via plugs 21. The support patterns 16 and the lower via plugs 21 may be disposed to partially overlap each other in a vertical direction. In other embodiments, the length of the support patterns 16 may be shorter than the length of one side of the lower via plugs 21.

Figure 1C:
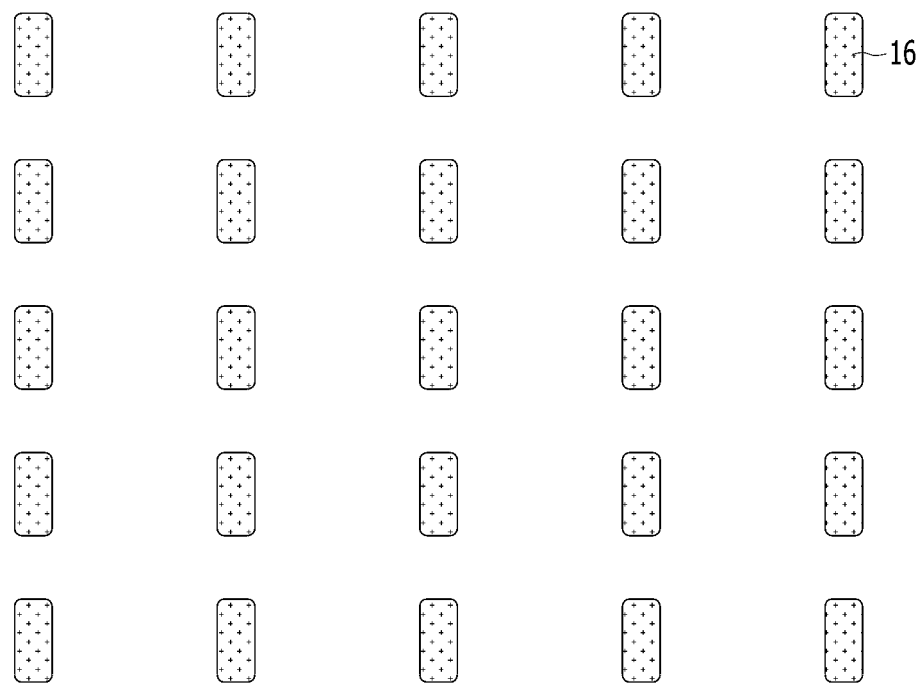
FIG. 1C is a layout illustrating an arrangement of support patterns of a 3D semiconductor device in accordance with an embodiment of the present disclosure.

FIG. 1C is a layout illustrating an arrangement of support patterns of a 3D semiconductor device in accordance with an embodiment of the present disclosure. Referring to FIG. 1C, support patterns 16 may be arranged in a matrix form in a row direction and a column direction. The support patterns 16 may have a rectangular segment shape or a square shape. That is, the support patterns 16 may be spaced apart from each other in the row direction and the column direction.

Figure 1D:
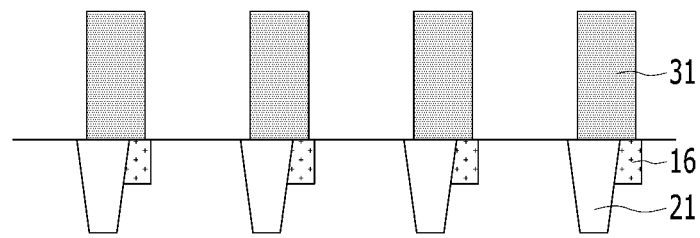
FIG. 1D is a longitudinal cross-sectional view illustrating that the lower via plugs and the upper via plugs are misaligned.

FIG. 1D is a longitudinal cross-sectional view illustrating lower via plugs misaligned with upper via plugs in a 3D semiconductor device. Referring to FIG. 1D, even if lower via plugs 21 and upper via plugs 31 are misaligned, the upper via plugs 31 may remain electrically connected to the lower via plugs 21 through conductive support patterns 16. That is, each support pattern 16 may increase an effective contact area between each lower via plug 21 and each upper via plug 31. Thus, each support pattern 16 may improve an alignment margin between each lower via plug 21 and each upper via plug 31. Accordingly, when the lower via plugs 21 and the upper via plugs 31 are misaligned, the support patterns 16 may alleviate contact resistance increases between the lower via plugs 21 and the upper via plugs 31.

In FIGS. 1A to 1D, the support patterns 16 are disposed on only the right sides of the lower via plugs 21, but the support patterns 16 may be disposed on the left sides of the lower via plugs 21. In other embodiments, the support patterns 16 may be disposed on the front sides, the rear sides, or both the front and rear sides of the lower via plugs 21.

Figure 2A:
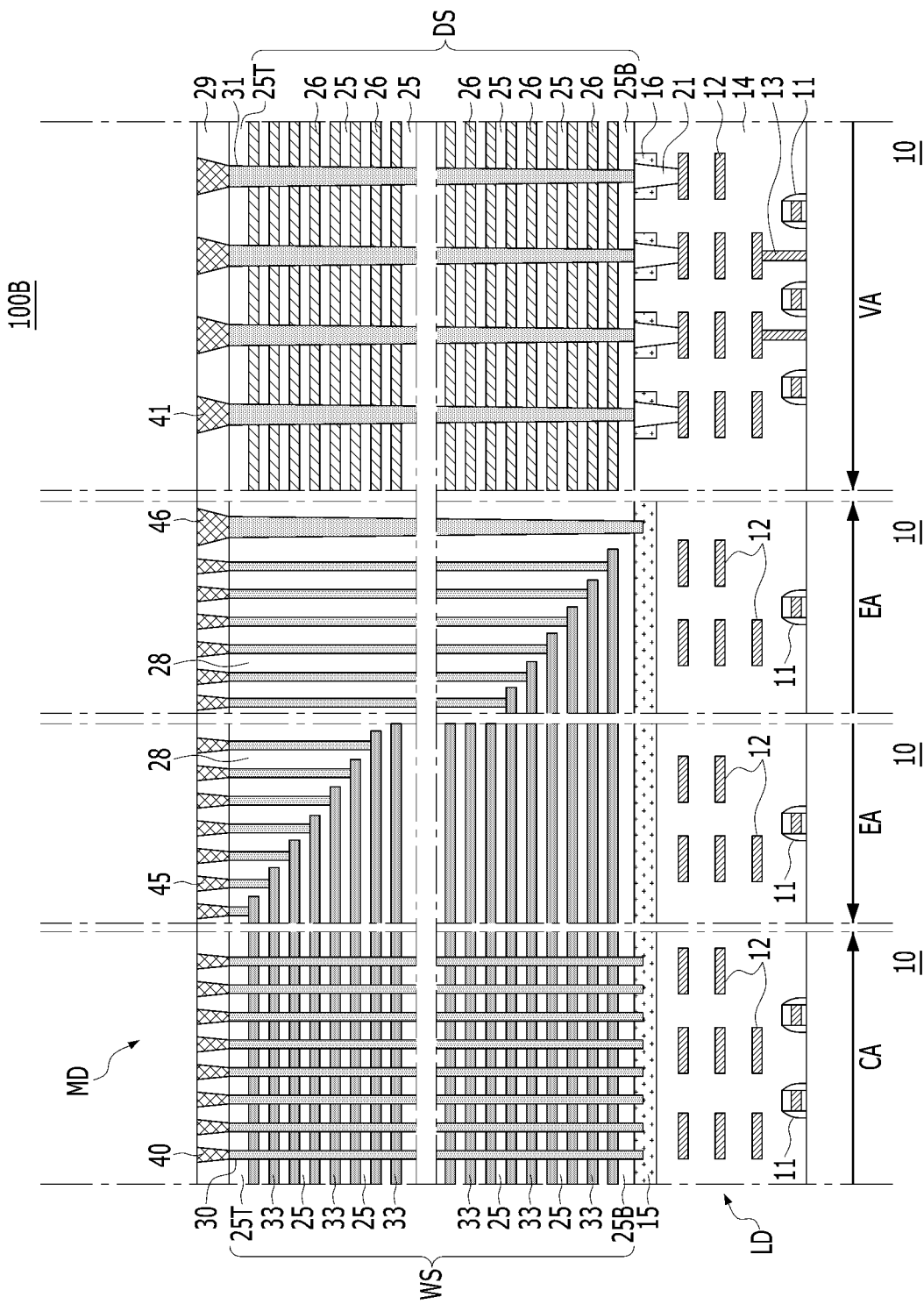
FIG. 2A is a schematic longitudinal cross-sectional view illustrating a 3D semiconductor device in accordance with an embodiment of the present disclosure.

FIG. 2A is a schematic longitudinal cross-sectional view illustrating a 3D semiconductor device in accordance with an embodiment of the present disclosure. Referring to FIG. 2A, a 3D semiconductor device 100B, in comparison with a 3D semiconductor device 100A shown in FIG. 1A, may include support patterns 16 disposed on both sides of lower via plugs 21. Other elements in FIG. 2A are substantially the same as like-numbered elements of FIG. 1A.

Figure 2B:
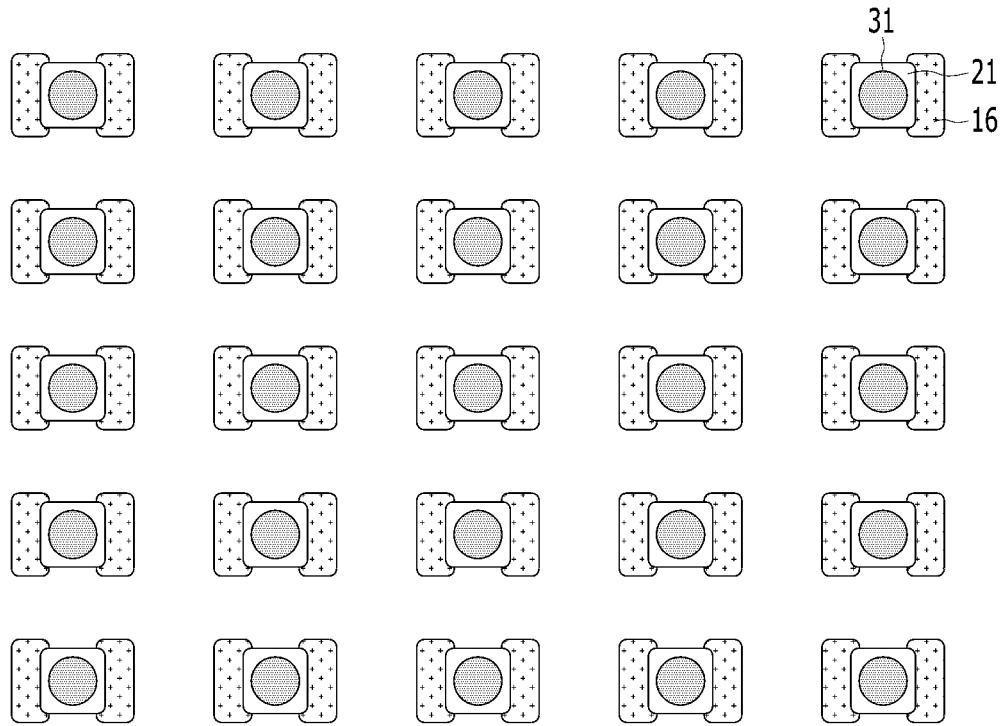
FIG. 2B is a layout illustrating alignment of lower via plugs, upper via plugs, and support patterns.
Figure 2C:
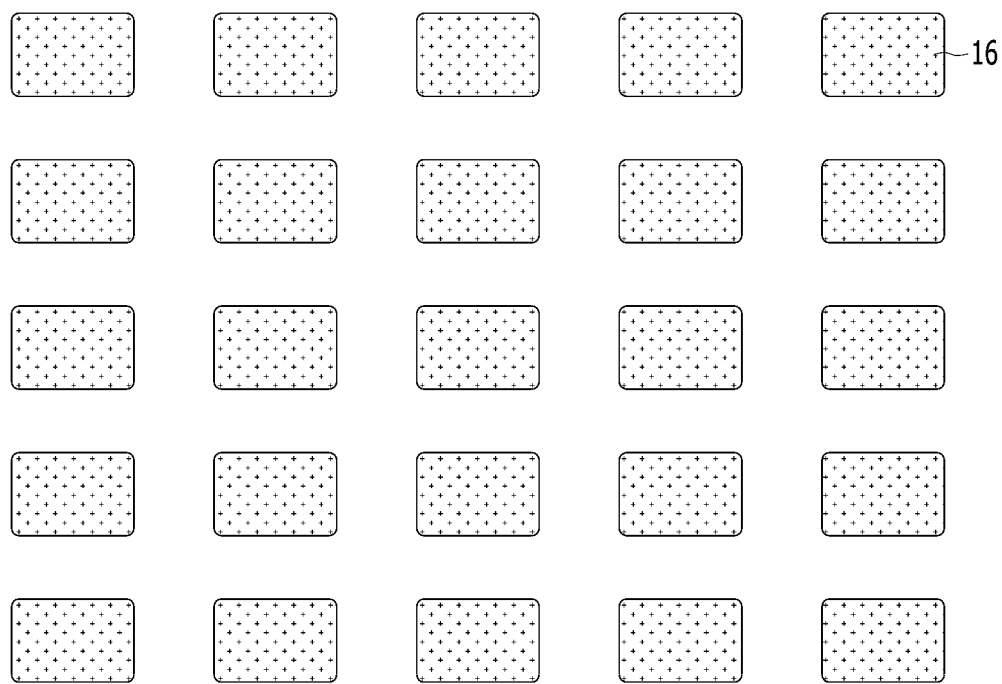
FIGS. 2C and 2D are layouts illustrating support patterns of a 3D semiconductor device in accordance with an embodiment of the present disclosure.
Figure 2D:
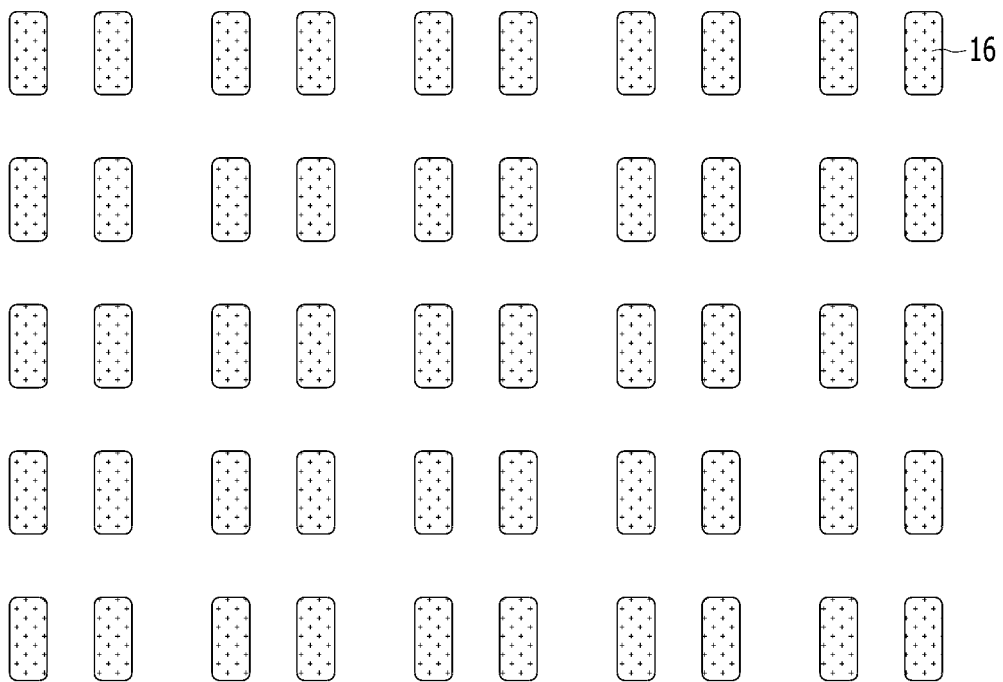

FIG. 2B is a layout illustrating alignment of lower via plugs, upper via plugs, and support patterns, and FIGS. 2C and 2D are layouts illustrating support patterns of a 3D semiconductor device 100B in accordance with an embodiment of the present disclosure.

Referring to FIG. 2B, each of support patterns 16 may have a segment shape having a long side longer than corresponding side of lower via plugs 21. Each of the lower via plugs 21 may be disposed at the center of one corresponding pair of support patterns 16. For example, a support pattern 16 may be divided into a pair of support patterns 16 by the respective lower via plug 21.

Referring to FIG. 2C, support patterns 16 may have a segment shape or a square shape and may be arranged in a matrix form. With further reference to FIGS. 2A and 2B, lower via plug 21 may be disposed to overlap with an intermediate region of the support patterns 16, in the row direction, in the column direction, or in both the row and column directions.

Referring to FIG. 2D, a pair of support patterns 16 may be disposed to contact both corresponding sidewalls of lower via plugs 21. That is, each of the support patterns 16 shown in FIG. 2C may be divided into two. The lower via plugs 21 may be disposed between the two support patterns 16. The lower via plugs 21 may partially overlap the two support patterns 16 in the vertical direction. The pairs of the support patterns 16 may be arranged in a matrix form.

Figure 2E:
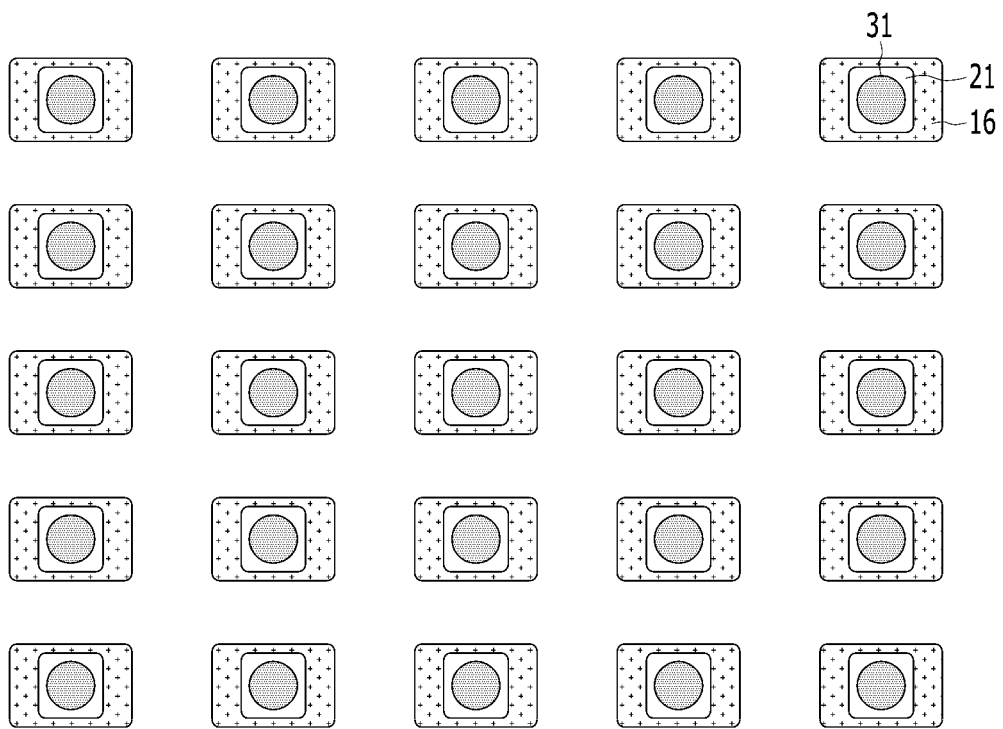
FIG. 2E is a layout illustrating an alignment of lower via plugs, upper via plugs, and support patterns of a 3D semiconductor device in accordance with an embodiment of the present disclosure.

FIG. 2E is a layout illustrating an alignment of lower via plugs 21, upper via plugs 31, and support patterns 16 of a 3D semiconductor device in accordance with an embodiment of the present disclosure. Referring to FIG. 2E, each of the support patterns 16 may be disposed to surround four sides of each of the lower via plugs 21. That is, the support patterns 16 may have a frame-like shape in the top view. Each of the lower via plugs 21 may be disposed to completely vertically overlap each of the support patterns 16.

In embodiments disclosed herein, the support patterns 16 may compensate for the pattern density of the vias in via area VA. In addition, when forming the lower conductive layer 15 in the cell area CA, a series of patterns in the via area VA may be formed at the same time and of the same material to form support patterns 16, which may alleviate patterning loading effects created by a pattern density of the vias in via area VA.

Figure 3A:
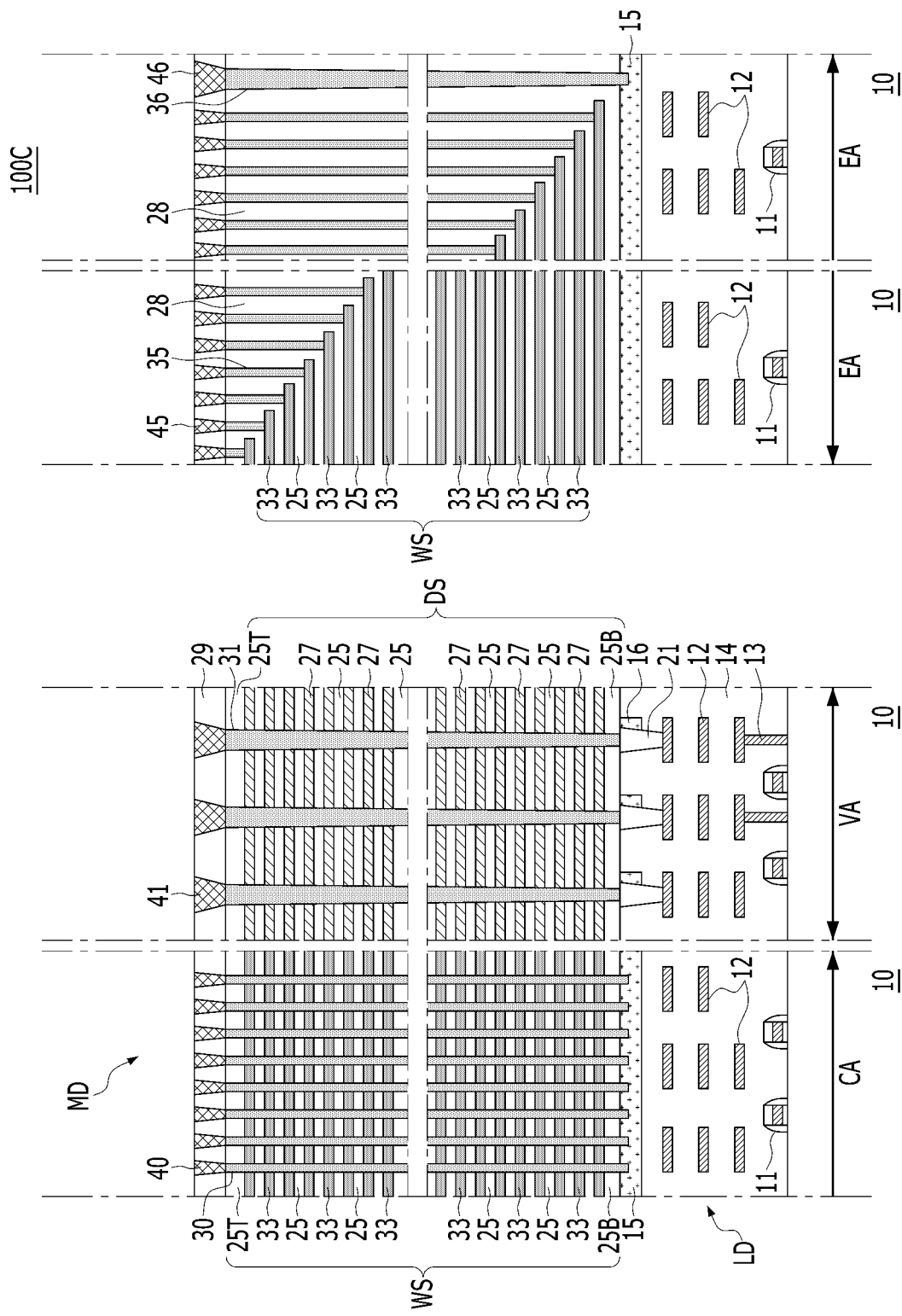
FIGS. 3A to 3C are longitudinal cross-sectional views schematically illustrating 3D semiconductor devices in accordance with various embodiments of the present disclosure.
Figure 3B:
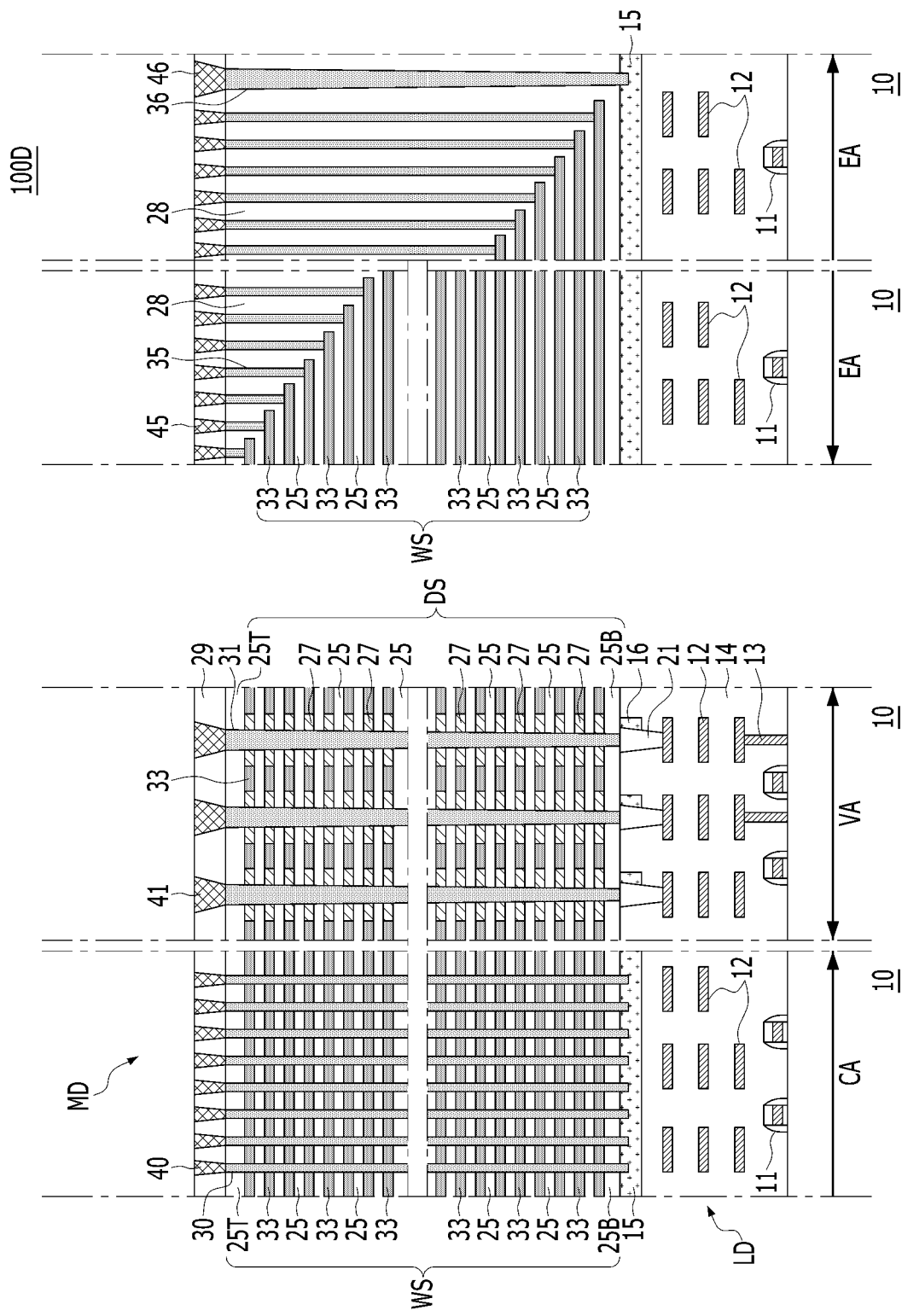
Figure 3C:
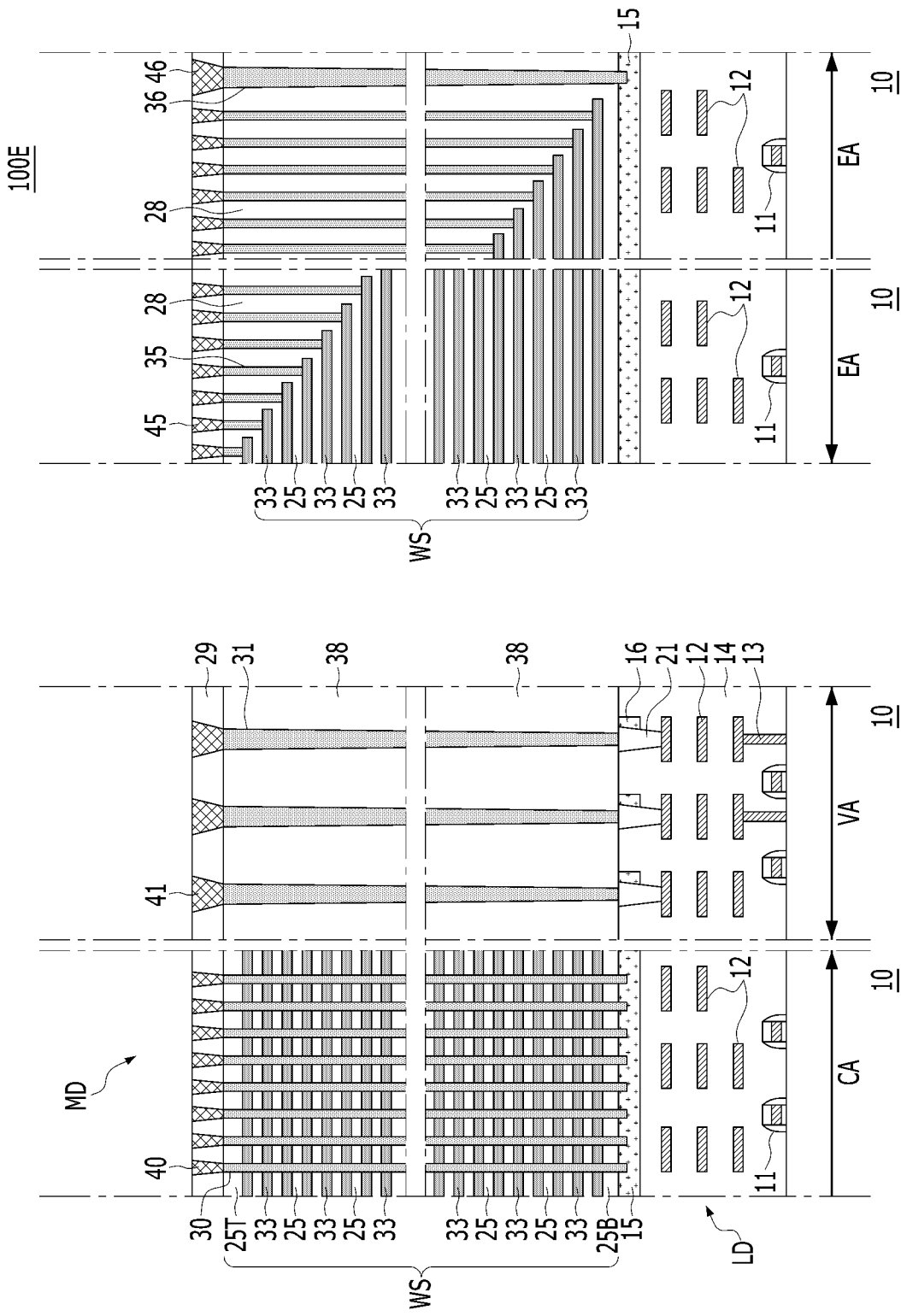

FIGS. 3A to 3C are longitudinal cross-sectional views schematically illustrating 3D semiconductor devices in accordance with various embodiments of the present disclosure. Referring FIGS. 3A to 3C, each of 3D semiconductor devices 100C-100E in accordance with various embodiments of the present disclosure may include a cell area CA, an extension area EA, and a via area VA between the cell area CA and the extension area EA. In one embodiment, the via area VA may be disposed in the cell area CA. In one embodiment, the via area VA may be disposed in the extension area EA.

Referring to FIG. 3A, comparing a 3D semiconductor device 100C to a 3D semiconductor device 100A shown in FIG. 1A, the 3D semiconductor device 100C may include a dielectric layer stack DS, lower via plugs 21, support patterns 16, upper via plugs 31, and via studs 41 in the via area VA between the cell area CA and the extension area EA. The dielectric layer stack DS may include first insulating layers 25 and third insulating layers 27 that are alternately stacked. The third insulating layers 27 may include an insulating material having an etching selectivity with the first insulating layers 25. For example, the third insulating layers 27 may include the same material as the second insulating layers 26 of FIG. 1A. Elements not described will be understood with reference to FIG. 1A. In FIG. 3A, word lines 33 in the cell area CA and word lines 33 in the extension area EA are shown as separated, but the word lines may be electrically and physically connected.

Referring to FIG. 3B, a 3D semiconductor device 100D in accordance with an embodiment of the present disclosure may further include word lines 33 horizontally disposed between the third insulating layers 27 in the via area VA. In a top view or a plan view, the third insulating layers 27 may have a ring-like shape surrounding sidewalls of the upper via plugs 31. The word lines 33 may surround side surfaces of the third insulating layers 27. Accordingly, the word lines 33 may be horizontally electrically and physically connected with each other. Elements not described will be understood with reference to FIGS. 1A and 3A.

Referring to FIG. 3C, a 3D semiconductor device 100E in accordance with an embodiment of the present disclosure may further include a gap-fill insulating layer 38 surrounding side surfaces of the upper via plugs 31 in the via region VA. The upper via plugs 31 may be disposed to vertically penetrate the gap-fill insulating layer 38. The gap-fill insulating layer 38 may include the same material as the intermediate insulating layer 28. Elements not described will be understood with reference to FIGS. 1A and 3A.

The inventive concepts of the embodiments described with reference to FIGS. 1B to 1D and 2B to 2E may be commonly applied to the 3D semiconductor devices 100C-100E described with reference to FIGS. 3A to 3C.

Figure 4A:
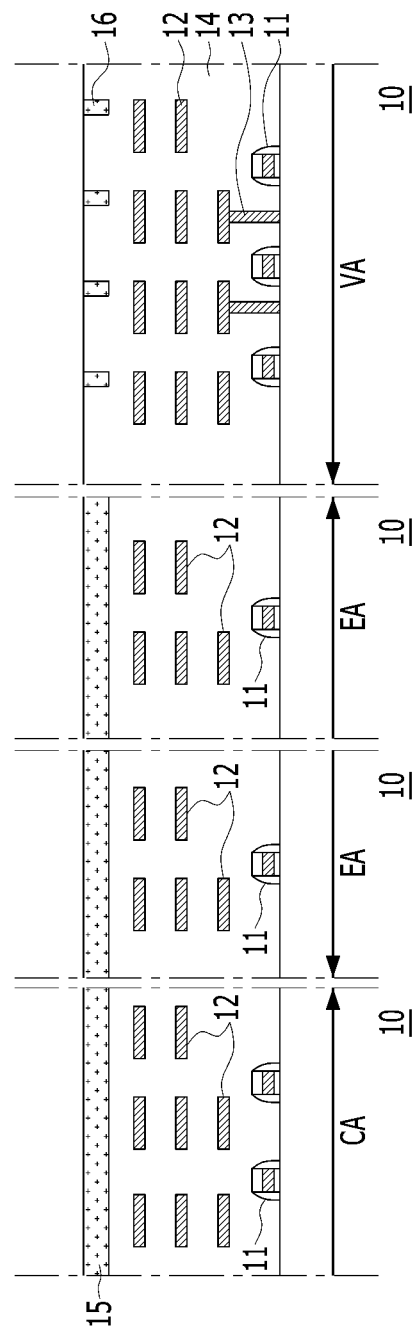
FIGS. 4A to 9C are diagrams illustrating various methods of manufacturing 3D semiconductor devices in accordance with embodiments of the present disclosure.

FIGS. 4A to 4I are diagrams illustrating a method of manufacturing a 3D semiconductor device in accordance with an embodiment of the present disclosure. Referring to FIG. 4A, a method of manufacturing a 3D semiconductor device may include forming, on a substrate 10, logic circuit components 11 to 13, a lower insulating layer 14, a lower conductive layer 15, and support patterns 16.

The substrate 10 may include a semiconductor wafer. For example, the substrate 10 may include a silicon wafer, a silicon-on-insulator (SOI), an epitaxially grown semiconductor layer, or one of various other semiconducting layers. The substrate 10 may include a cell area CA, an extension area EA, and a via area VA.

The logic circuit components 11 to 13 may include MOS transistors 11, logic interconnections 12, and logic via plugs 13. The logic interconnections 12 and the logic via plugs 13 may include a conductor such as metal. A deposition process may be performed to form the lower insulating layer 14, which may include an insulating material such as silicon oxide.

Forming the lower conductive layer 15 and the support patterns 16 may include forming a poly-silicon layer doped with N-type ions on the lower insulating layer 14. The method may further include performing a chemical mechanical polishing (CMP) process to planarize top surfaces of the lower conductive layer 15, the support patterns 16, and the lower insulating layer 14 to be coplanar. The lower conductive layer 15 and the support patterns 16 may be used as a CMP stopper or a CMP resistor. The support patterns 16 may prevent or mitigate dishing of the lower insulating layer 14 in the via region VA by the CMP process. The lower conductive layer 15 may be formed in a plate shape in the cell area CA and the extension area EA. Referring to FIG. 1C, in the layout or the top view, the support patterns 16 may have one of a segment shape, a bar shape, or a square shape, and the support patterns 16 may be arranged in a matrix shape.

Figure 4B:
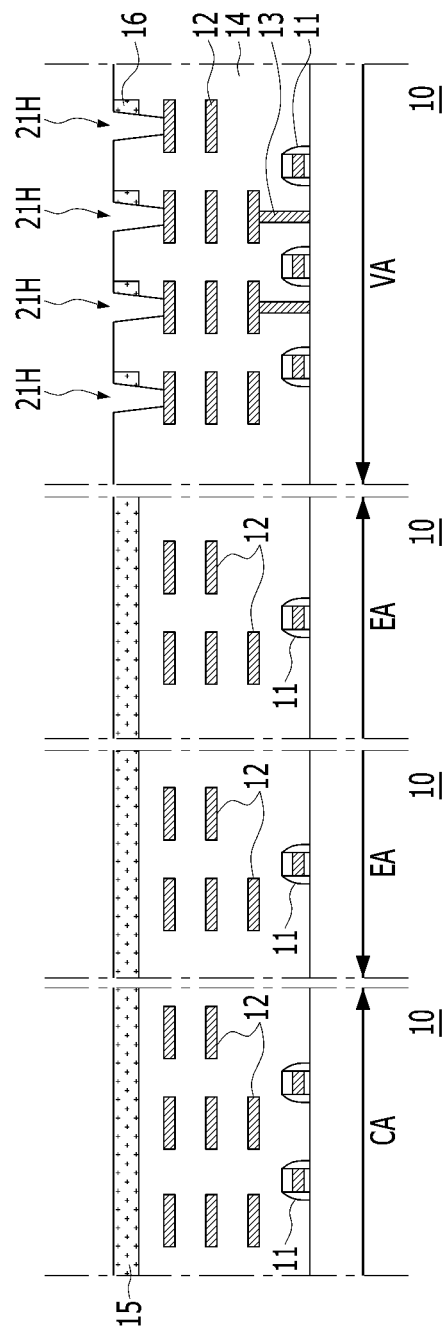

Referring to FIG. 4B, the method may further include forming lower via holes 21H. The lower via holes 21H may selectively expose the surfaces of portions of the logic interconnections 12 of the via area VA. The support patterns 16 may abut the lower via holes 21H. For example, portions of the support patterns 16 may be removed. Accordingly, sidewalls of the support patterns 16 may be exposed on inner sidewalls of the lower via holes 21H.

Figure 4C:
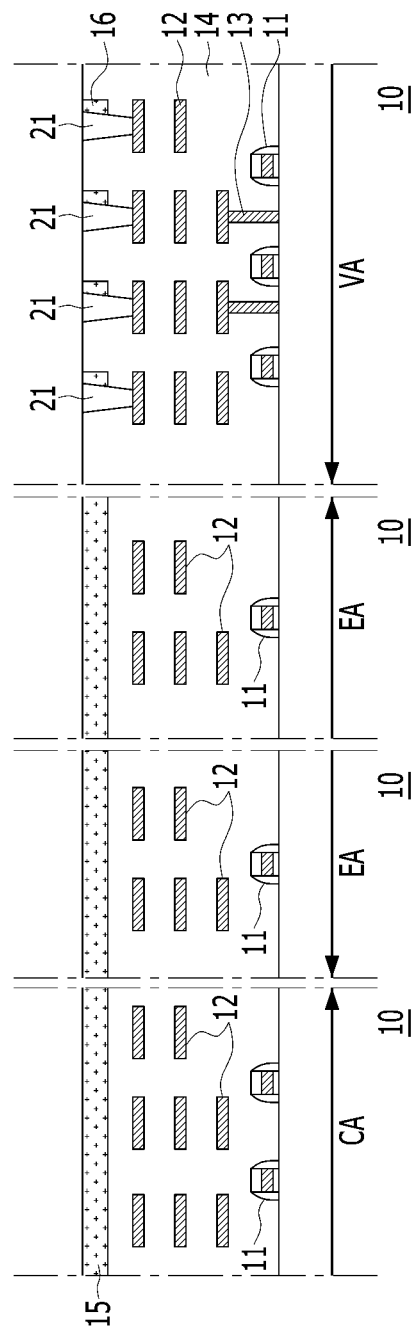

Referring to FIG. 4C, the method may further include filling a conductor in the lower via holes 21H to form the lower via plugs 21. The lower via plugs 21 may include at least one of polysilicon doped with N-type ions, a metal, a metal silicide, or a metal compound. In one embodiment, the lower via plugs 21 may include at least one of tungsten (W), aluminum (Al), titanium (Ti), tantalum (Ta), nickel (Ni), cobalt (Co), copper (Cu), or other transition metals or refractory metals. In one embodiment, the lower via plugs 21 may include at least one of tungsten silicide (WSi), titanium silicide (TiSi), tantalum silicide (TaSi), nickel silicide (NiSi), cobalt silicide (CoSi), or other various metal silicides. In one embodiment, the lower via plugs 21 may include one of tungsten nitride (WN), titanium nitride (TiN), tantalum nitride (TaN), or various other metal nitrides. In one embodiment, the lower via plugs 21 may include polysilicon doped with N-type ions. In one embodiment, a barrier layer may be formed between each of the lower via plugs 21 and each of the support patterns 16. The barrier layer may include a metal silicide layer or a metal nitride layer. The method may further include performing a CMP process to planarize top surfaces of the lower via plugs 21. Accordingly, the top surfaces of the lower via plugs 21, the lower conductive layer 15, the support patterns 16, and the lower insulating layer 14 may be coplanar. In the CMP process, the support patterns 16 may be used as a CMP stopper or a CMP resistor. That is, the support patterns 16 can prevent and mitigate recesses (dishing) of the top surfaces of the lower via plugs 21 and the lower insulating layer 14 in the via region VA by the CMP process. The support patterns 16 may include the same material as the lower conductive layer 15. The support patterns 16 may have the same vertical thickness as the lower conductive layer 15.

Figure 4D:
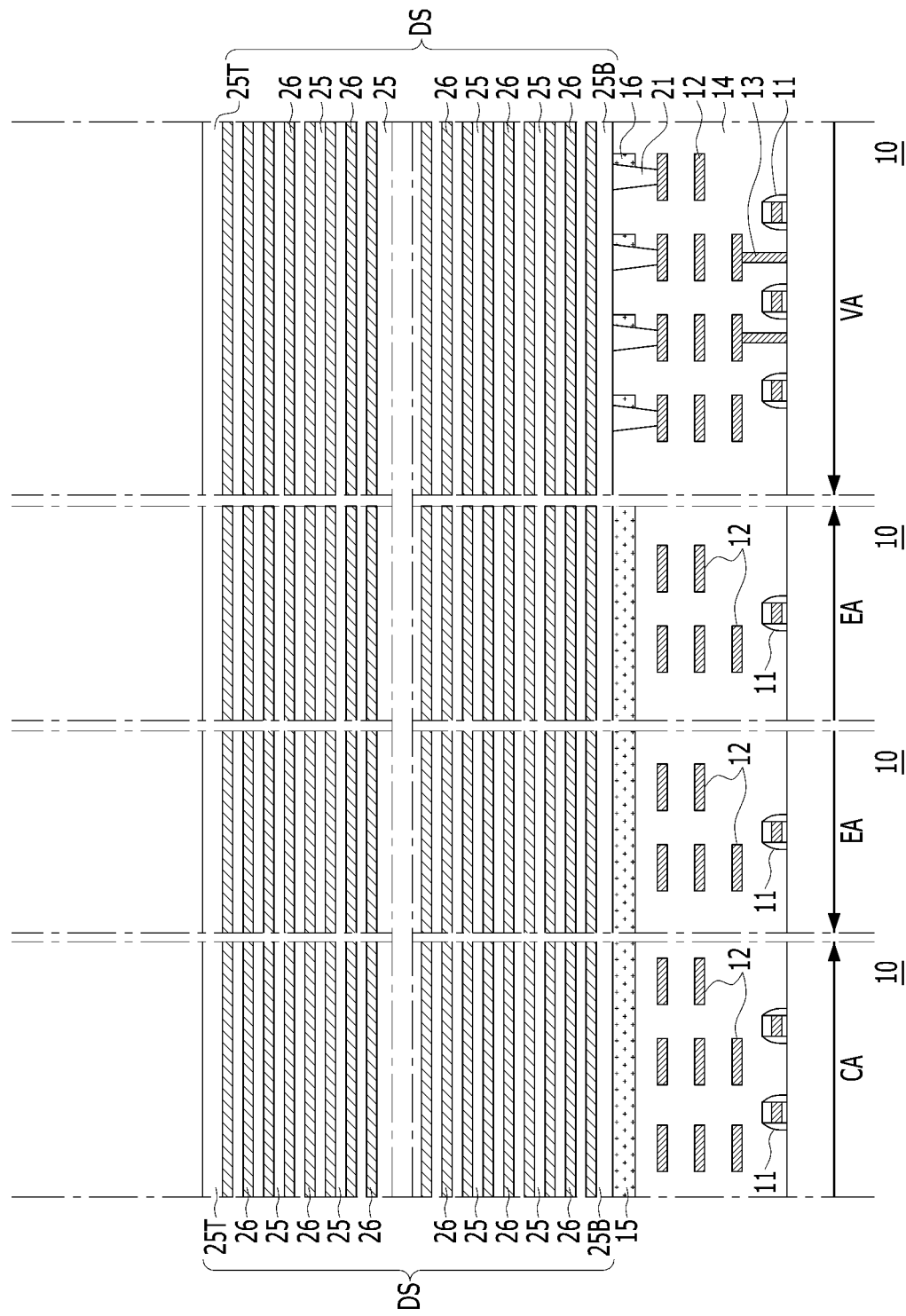

Referring to FIG. 4D, the method may further include forming a dielectric layer stack DS on the logic device layer LD. Forming the dielectric layer stack DS may include alternately stacking first insulating layers 25 and second insulating layers 26. For example, the first insulating layers 25 may include silicon oxide, and the second insulating layers 26 may include silicon nitride. First insulating layers 25B and 25T stacked on the lowermost and uppermost portions of the dielectric layer stack DS may be formed to be relatively thicker than the other first insulating layers 25.

Figure 4E:
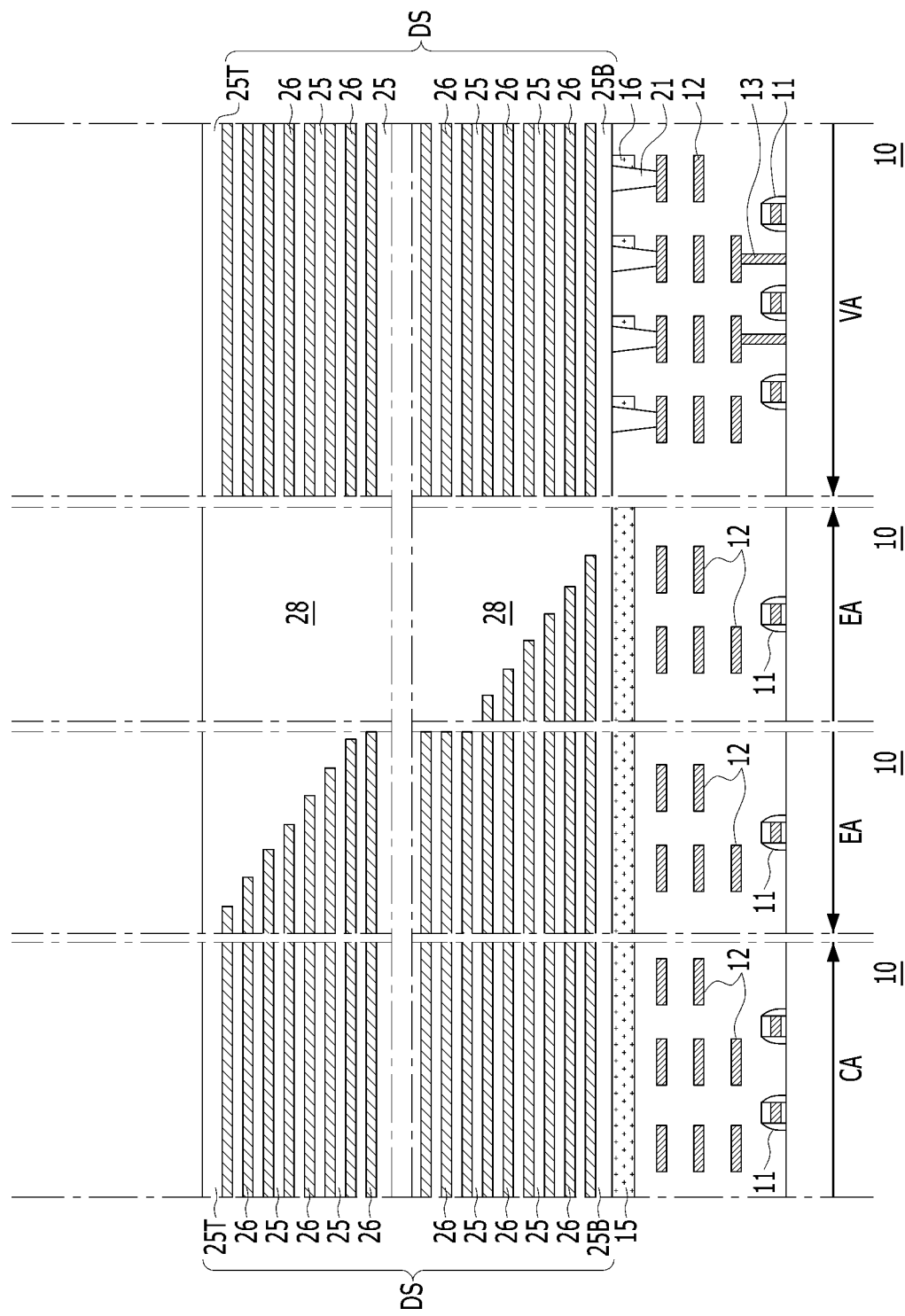

Referring to FIG. 4E, the method may include patterning the first insulating layers 25 and the second insulating layers 26 in the extension area EA to form a staircase. Subsequently, in the extension area EA, the first insulating layers 25, 25B, and 25T and the second insulating layers 26 may be removed, and the intermediate insulating layer 28 may be used to fill areas from which the first and second insulating layers 25, 25B, 25T, and 26 have been removed. The intermediate insulating layer 28 may include the same material as the first insulating layers 25.

Figure 4F:
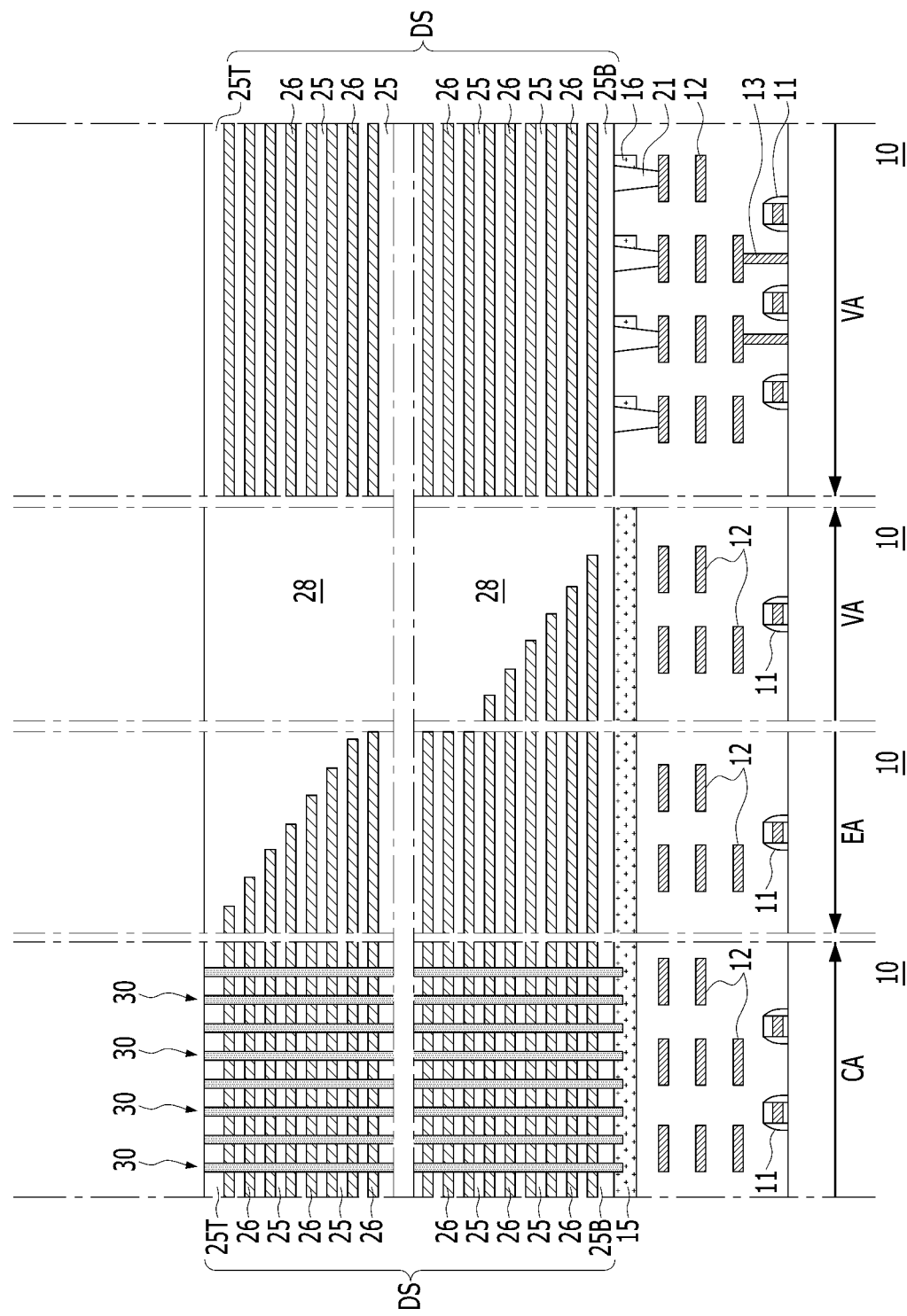

Referring to FIG. 4F, the method may further include forming vertical channel pillars 30 in the cell area CA. The vertical channel pillars 30 may include a central core insulating layer, a channel layer surrounding the core insulating layer, a memory layer surrounding the channel layer, and a tunneling insulating layer surrounding the memory layer. The vertical channel pillars 30 may be electrically connected to the lower conductive layer 15. For example, lower ends of the vertical channel pillars 30 may protrude into the lower conductive layer 15.

Figure 4G:
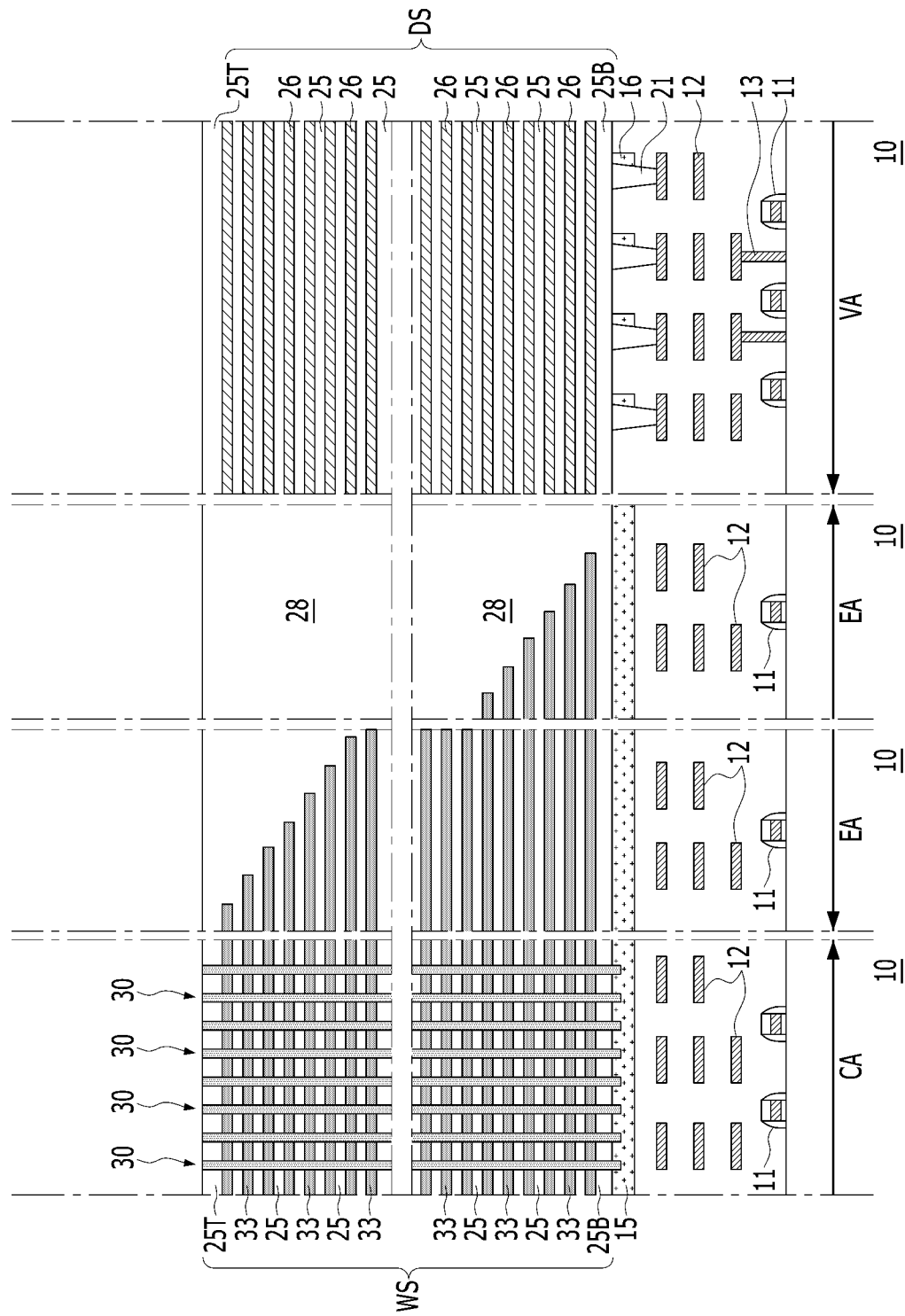

Referring to FIG. 4G, the method may include replacing the second insulating layers 26 with conductive word lines 33 to form a word line stack WS in the cell area CA and the extension area EA. For example, the method may include performing a wet pull-back process to remove the second insulating layers 26 and performing a deposition process to form a conductor such as silicon or metal in spaces from which the second insulating layers 26 are removed. The second insulating layers 26 in the via area VA, however, may not be removed in this step.

Figure 4H:
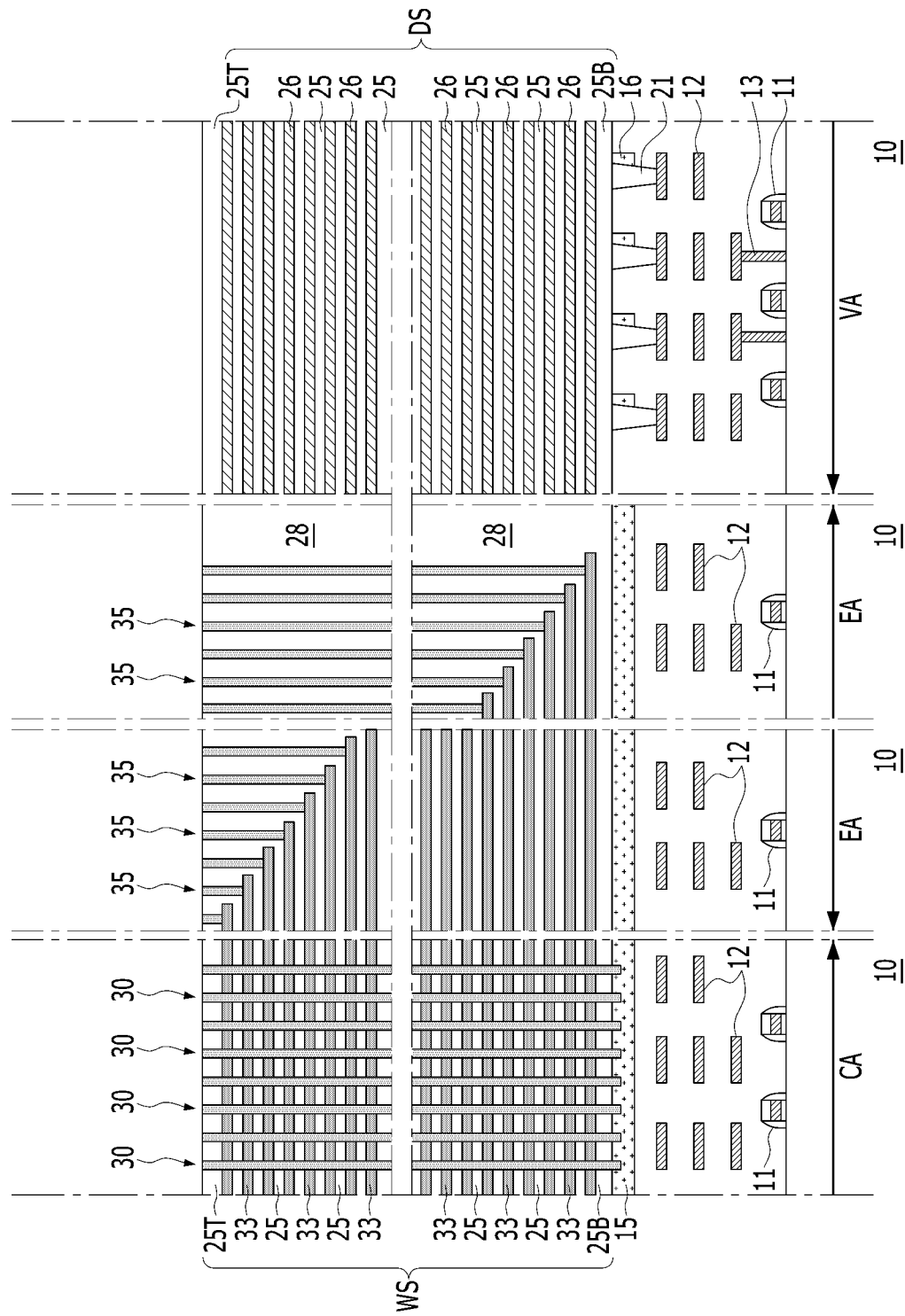

Referring to FIG. 4H, the method may further include forming word line contact plugs 35 in the extension area EA. The word line contact plugs 35 may contact and be connected to ends of the word lines 33 in the staircase, respectively. For example, forming the word line contact plugs 35 may include forming contact holes vertically penetrating the intermediate insulating layer 28 and exposing upper surfaces of the ends of the word lines 33, and filling the contact holes with a conductive material.

Figure 4I:
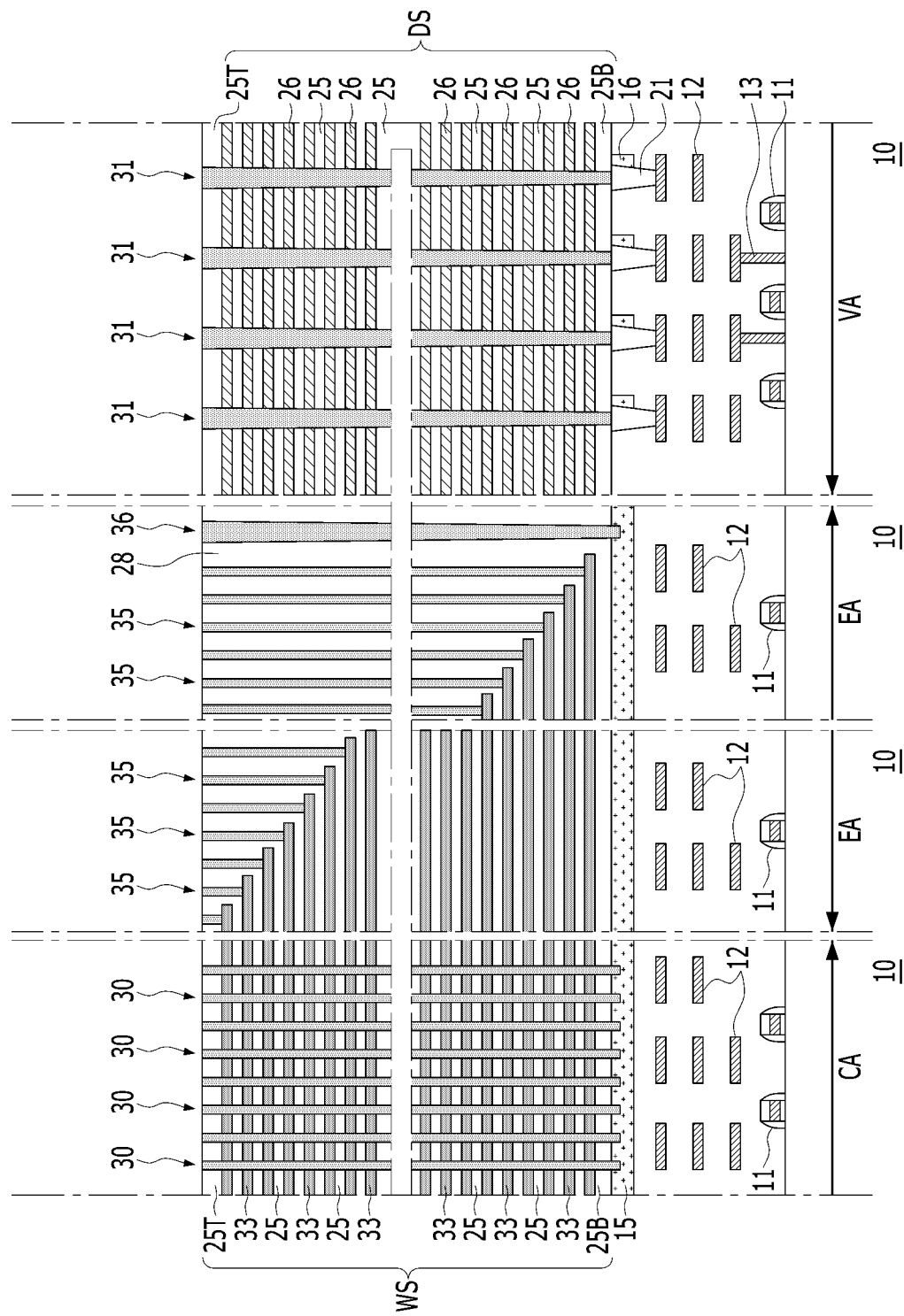

Referring to FIG. 4I, the method may further include forming through via plugs 36 and upper contact plugs 31. The through via plugs 36 may be formed in the extension area EA. For example, the forming the through via plugs 36 may include forming through via holes vertically penetrating the intermediate insulating layer 28 and exposing portions of the lower conductive layer 15 in the extension area EA and filling the through via holes with a conductive material. The upper contact plugs 31 may be formed in the via area VA. The forming the upper contact plugs 31 may include forming upper via holes vertically penetrating the first insulating layers 25 and the second insulating layers 26 and exposing the surfaces of the lower via plugs 21 in the via region VA and filling the upper via holes with a conductive material.

Referring to FIG. 1A, the method may include successively forming an upper insulating layer 29, vertical channel studs 40, word line contact studs 45, through via studs 46, and via studs 41.

The upper insulating layer 29 may include silicon oxide. The vertical channel studs 40 may vertically penetrate the upper insulating layer 29 to be in contact with and be electrically connected to the vertical channel pillars 30, respectively. The word line contact studs 45 may vertically penetrate the upper insulating layer 29 to be in contact with and be electrically connected to the word line contact plugs 35, respectively. The through via stud 46 may vertically penetrate the upper insulating layer 29 to be in contact with and be electrically connected to the through via plug 36. The via studs 41 may vertically penetrate the upper insulating layer 29 to be in contact with and be electrically connected to the upper via plugs 31, respectively. The vertical channel studs 40, the word line contact studs 45, the through via stud 46, and the via studs 41 may include at least one of polysilicon doped with N-type ions, a metal, a metal silicide, or a metal compound.

Figure 5A:
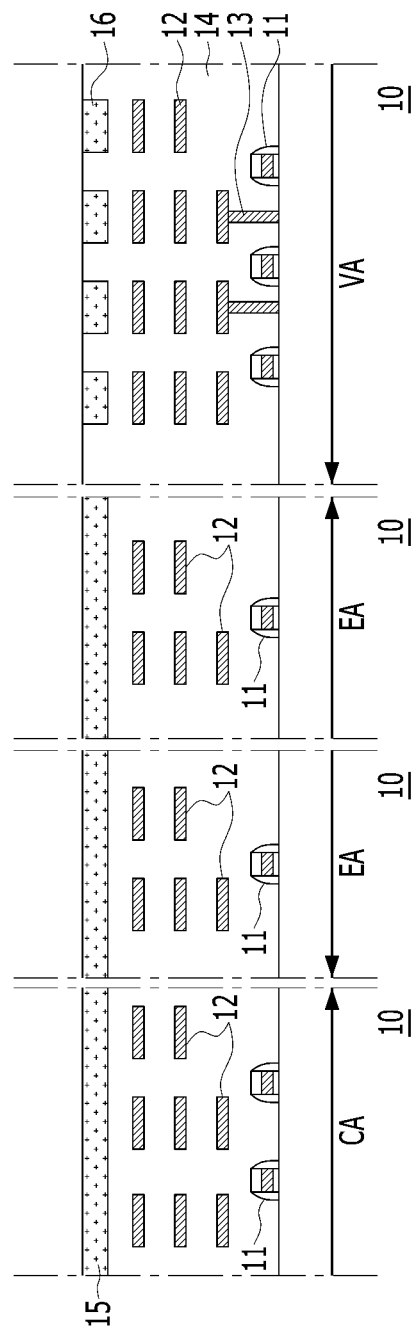
Figure 5B:
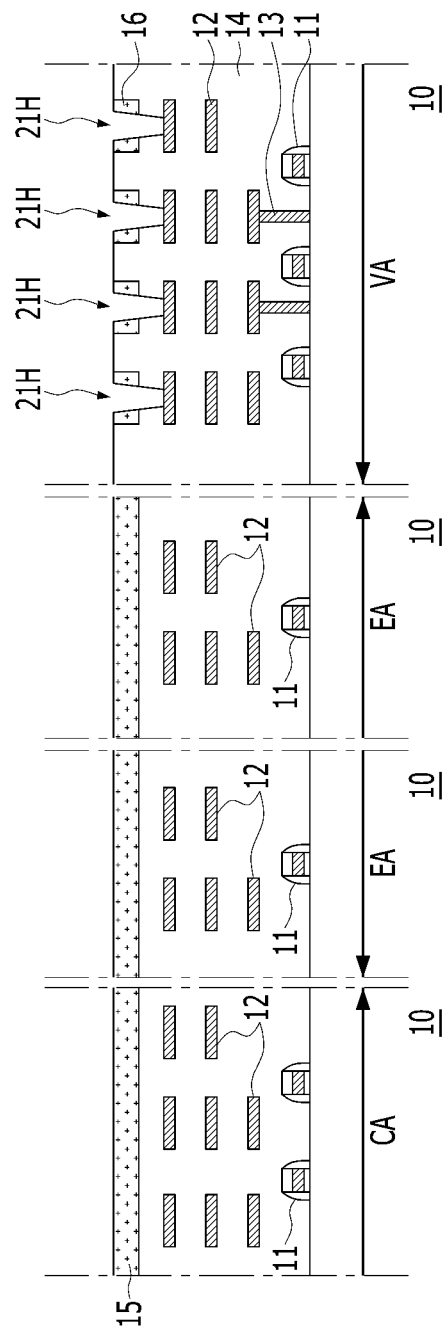
Figure 5C:
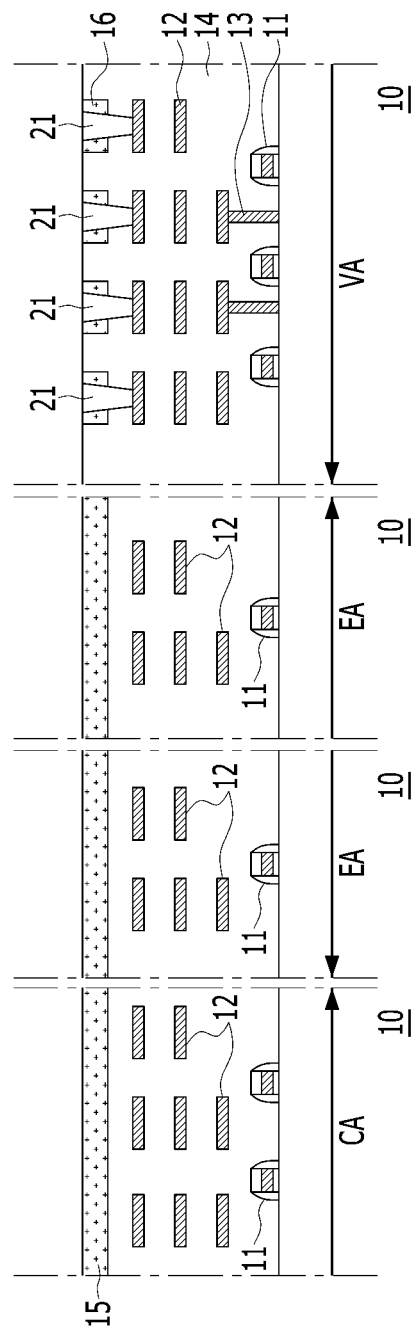

FIGS. 5A to 5C are diagrams illustrating a method of manufacturing a 3D semiconductor device in accordance with an embodiment of the present disclosure. Referring to FIG. 5A, a method of manufacturing a 3D semiconductor device may include forming, on a substrate 10, logic circuit components 11 to 13, a lower insulating layer 14, a lower conductive layer 15, and support patterns 16. Referring to FIG. 2C, in a layout or the top view, support patterns 16 may be arranged in a matrix form. The support patterns 16 may have one of a segment shape, a bar shape, or a square shape. In one embodiment, referring to FIG. 2E, each of the support patterns 16 may surround four sides of each of the lower via plugs 21. For example, each of the support patterns 16 may frame each of the lower via plugs 21 and contact four sides of each of the lower via plugs 21.

Referring to FIGS. 2C and 5B, the method may include forming lower via holes 21H, which may have a square or rectangular shape, that vertically penetrate the support patterns 16 to expose portions of the logic interconnections 12. The support patterns 16 may be exposed on at least two inner sidewalls of the lower via holes 21H.

Referring to FIG. 5C, the method may include forming lower via plugs 21 by filling the lower via holes 21H with a conductor. Sidewalls of each of the lower via holes 21H may be in contact with each of the support patterns 16.

The method may include successively performing the processes described above with reference to FIGS. 4D to 4I to manufacture remaining elements of a 3D semiconductor device 100B shown in FIG. 2A. Elements not described in detail may be understood with reference to other drawings.

Figure 6:
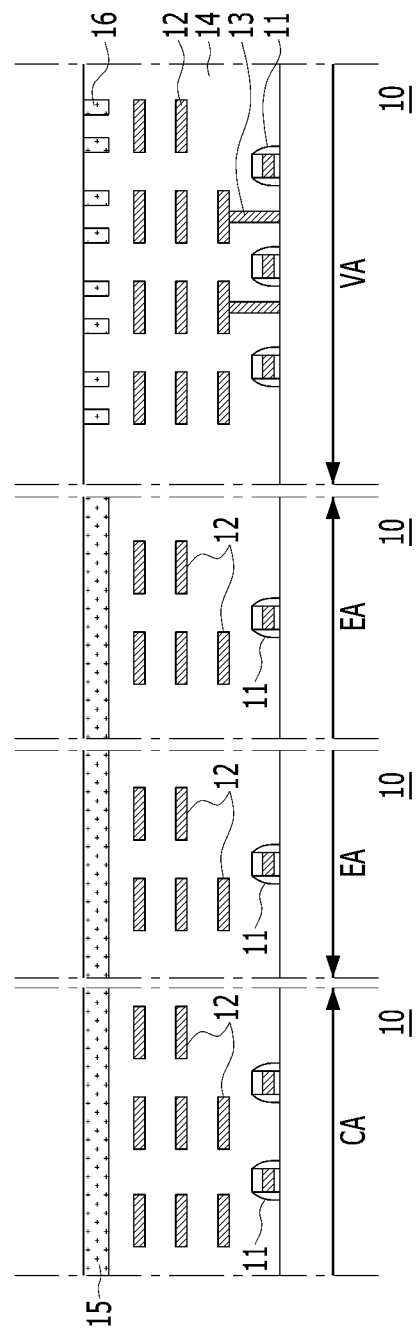

FIG. 6 is a diagram illustrating a method of manufacturing a 3D semiconductor device in accordance with an embodiment of the present disclosure. Referring to FIG. 6, a method of manufacturing a 3D semiconductor device in accordance with an embodiment of the present disclosure includes forming, on a substrate 10, logic circuit components 11 to 13, a lower insulting layer 14, a lower conductive layer 15, and support patterns 16. Referring to FIG. 2D, in a layout or top view, two support patterns 16 may each have one of a segment shape, a bar shape, or a square shape in contact with one of both sidewalls of the lower via plugs 21. For example, a pair of support patterns 16 may be disposed to contact both corresponding sidewalls of one of the lower via plugs 21, which may be disposed between two support patterns 16. The lower via plugs 21 may partially overlap the two support patterns 16 in the vertical direction. Elements and processes not described in detail may be understood with reference to other drawings.

Figure 7A:
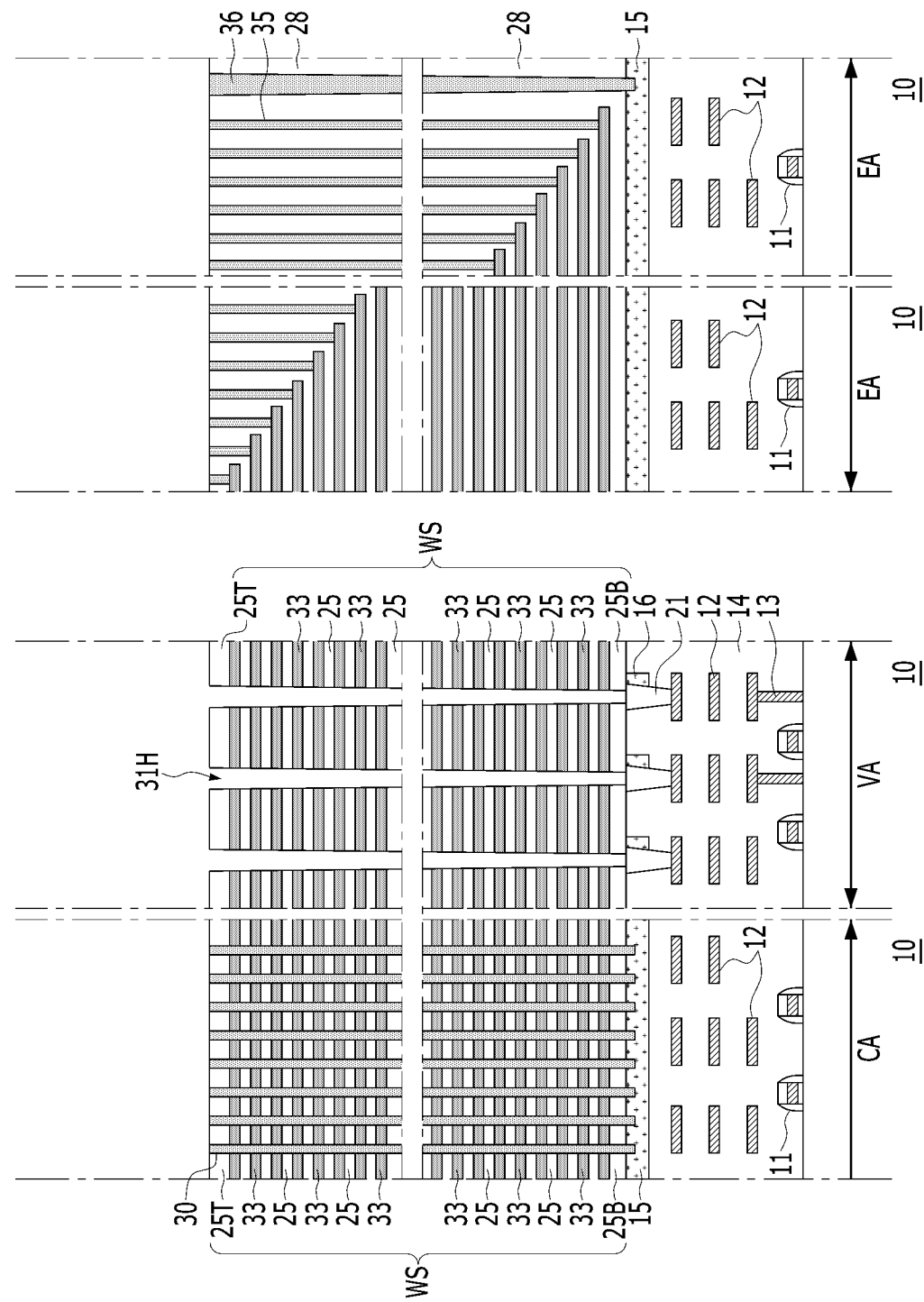

FIGS. 7A to 7D are diagrams illustrating a method of manufacturing a 3D semiconductor device in accordance with an embodiment of the present disclosure. Referring to FIG. 7A, a method of manufacturing a 3D semiconductor device may include performing the processes described with reference to FIGS. 4A to 4H to form via holes 31H. The via holes 31H may vertically penetrate a word line stack WS to expose surfaces of lower via plugs 21 in a via area VA.

Figure 7B:
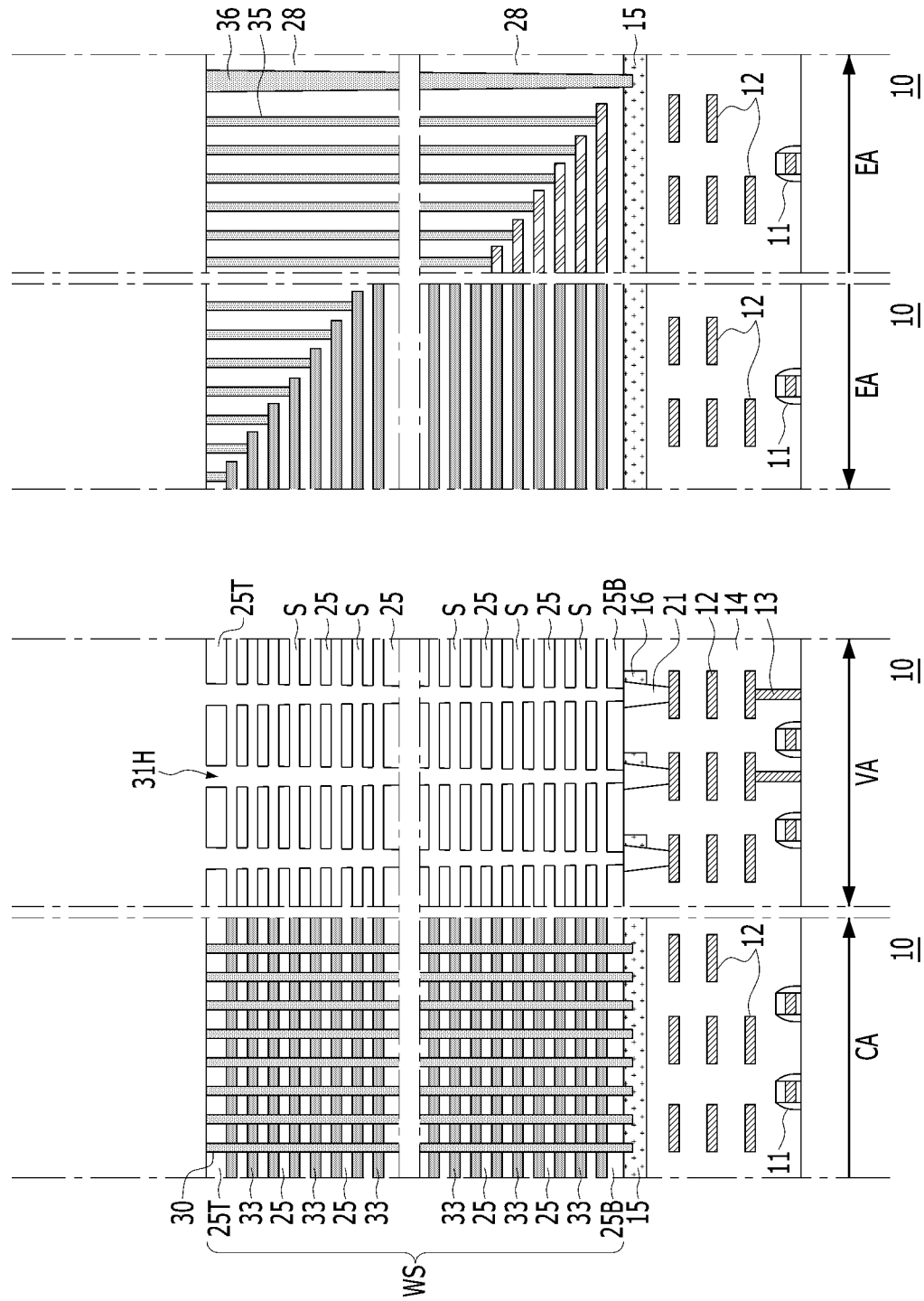

Referring to FIG. 7B, the method may further include removing word lines 33 of the word line stack WS through the via holes 31H. For example, the word lines 33 in the via area VA may be removed through a pull-back process. The word lines 33 may be removed to form spaces S between first insulating layers 25.

Figure 7C:
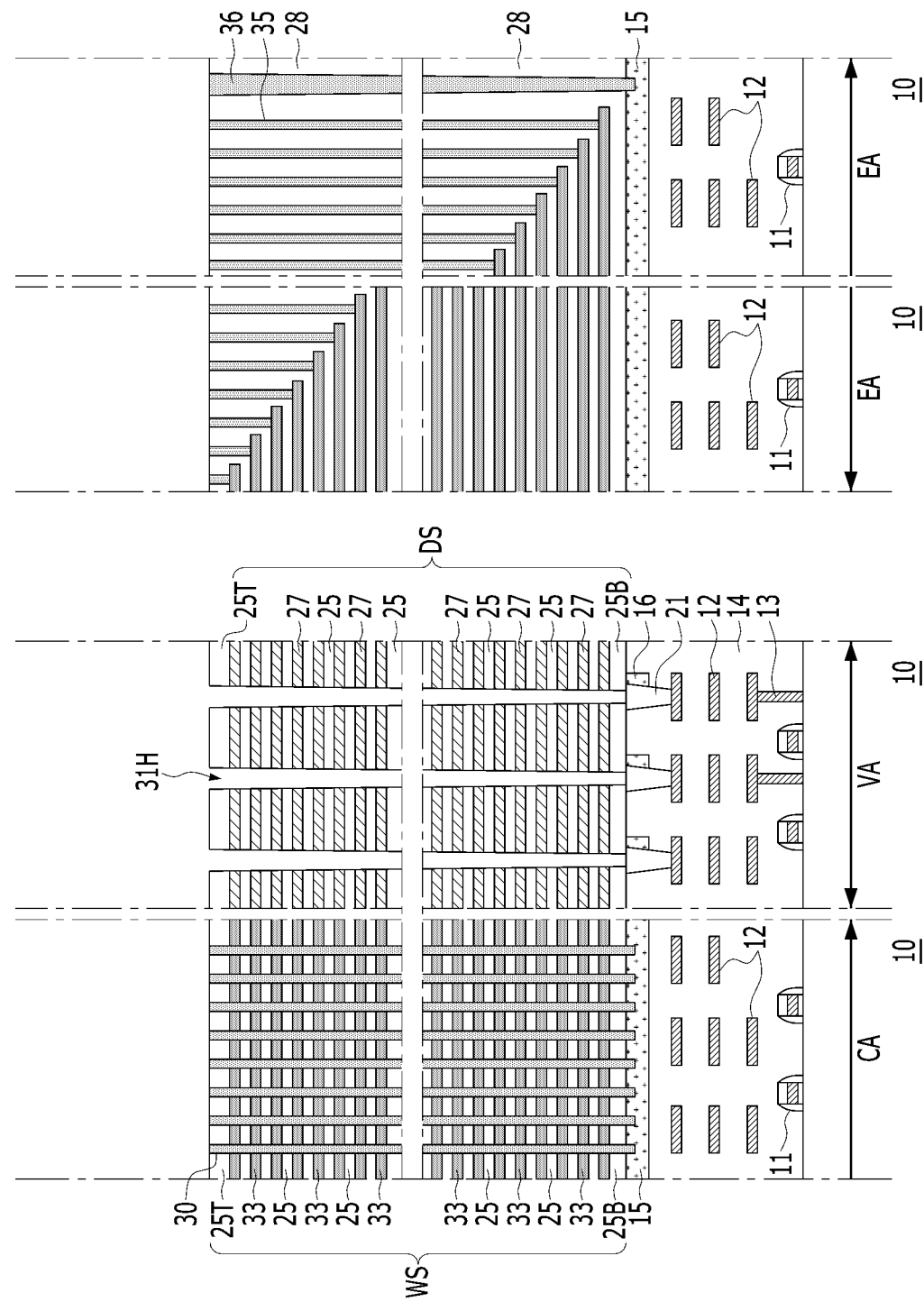

Referring to FIG. 7C, the method may further include forming a third insulating layer 27 in the spaces S using the via holes 31H. Although not shown, the third insulating layer 27 may also be formed on inner walls of the via hole 31H.

Figure 7D:
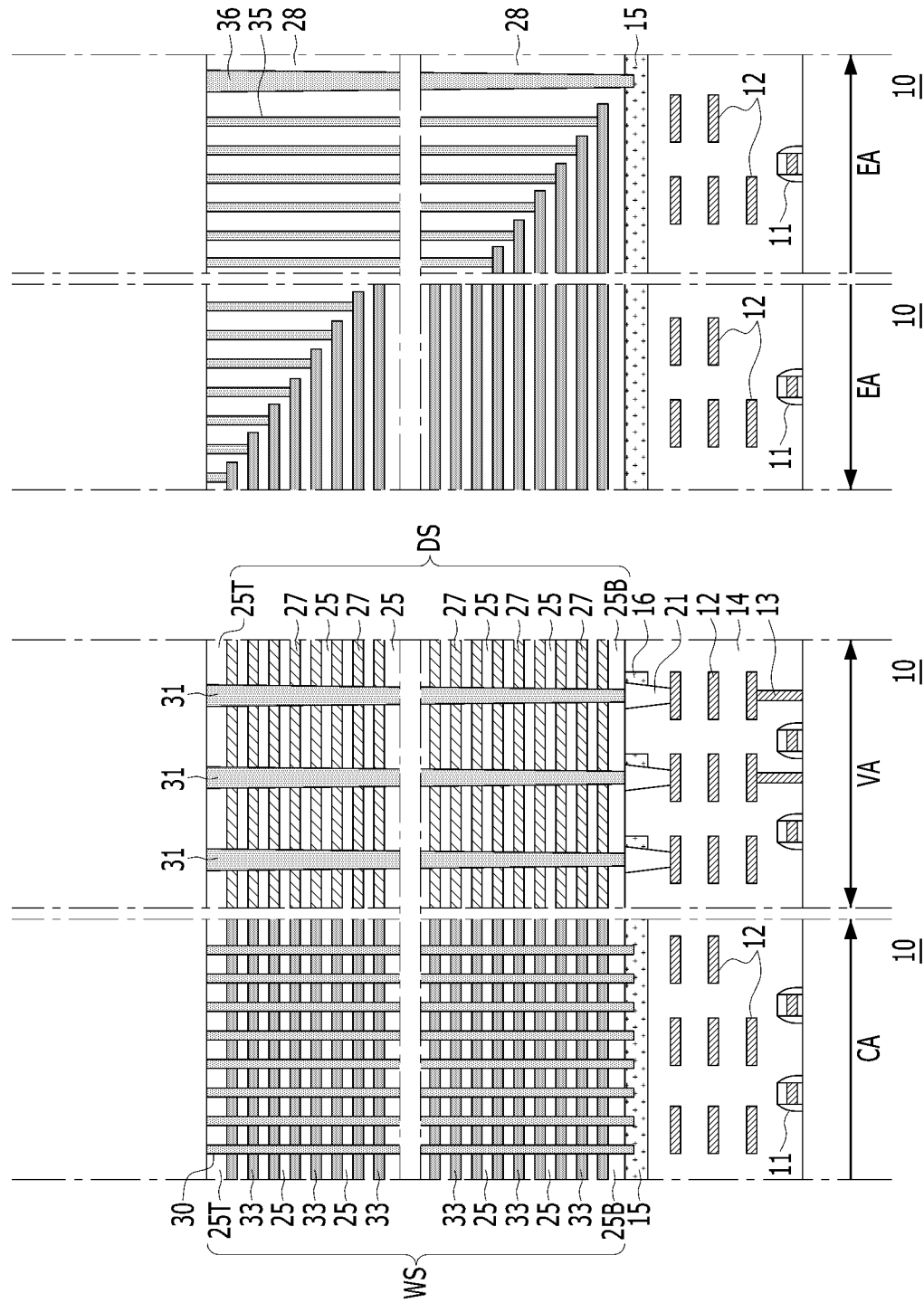

Referring to FIG. 7D, the method may further include forming an upper via plug 31 in the via hole 31H.

Referring to FIG. 3A, the method further includes successively forming an upper insulating layer 29, vertical channel studs 40, word line contact studs 45, through via studs 46, and via studs 41. Elements and processes not described in detail may be understood with reference to other drawings.

In one embodiment, a through via plug 36 in an extension area EA may be formed with a word line contact plug 35 at the same time. In one embodiment, the through via plug 36 in the extension area EA may be formed with the upper via plug 31 at the same time.

Figure 8A:
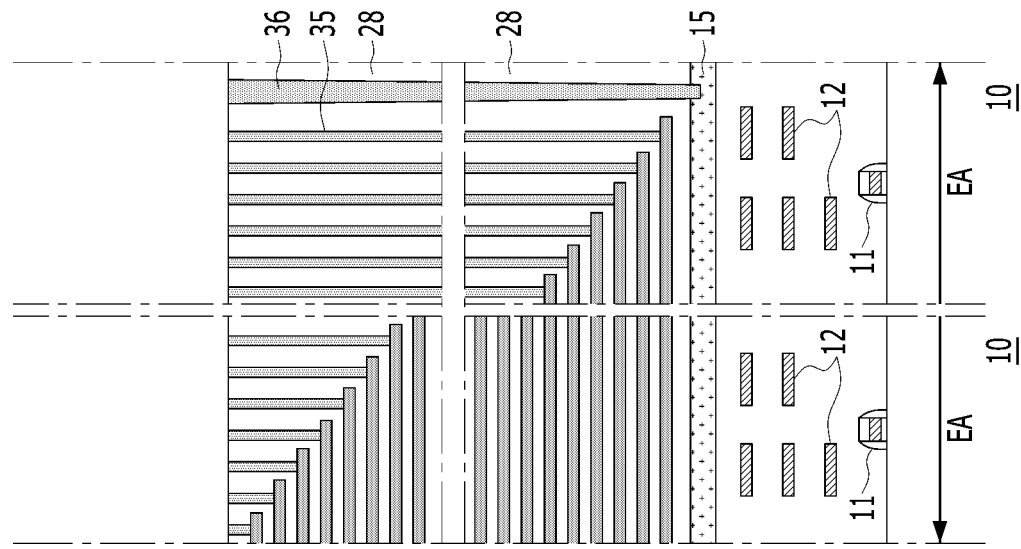
Figure 8A:
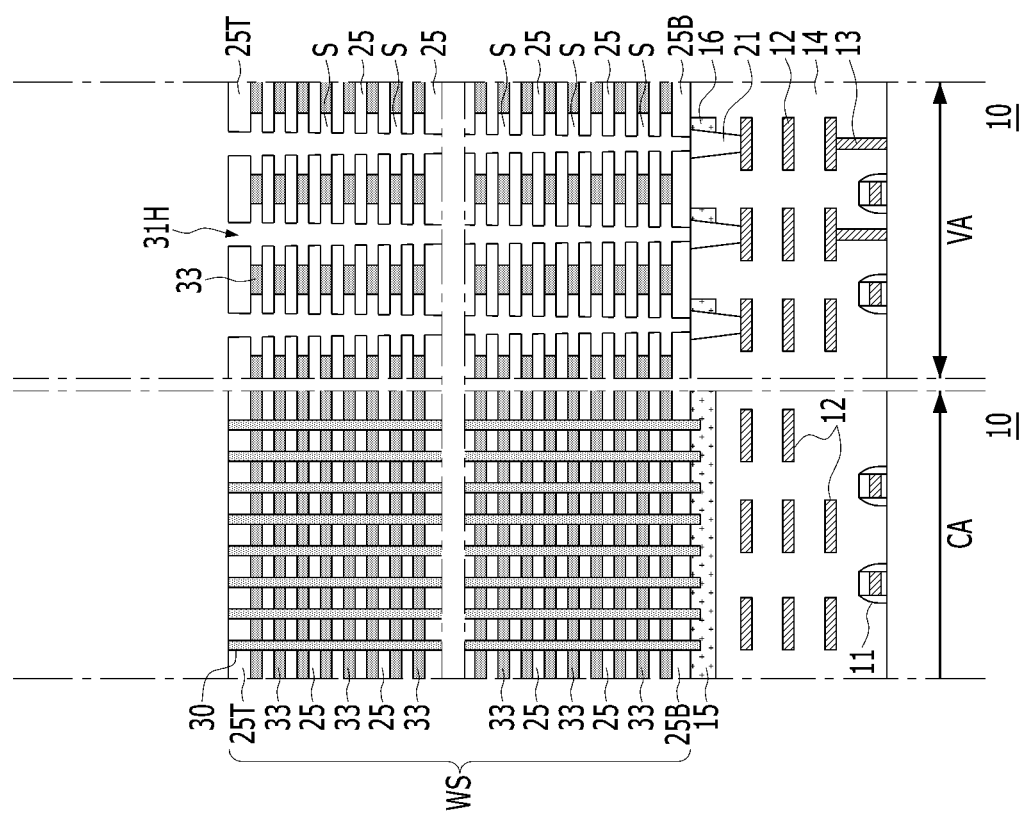
Figure 8B:
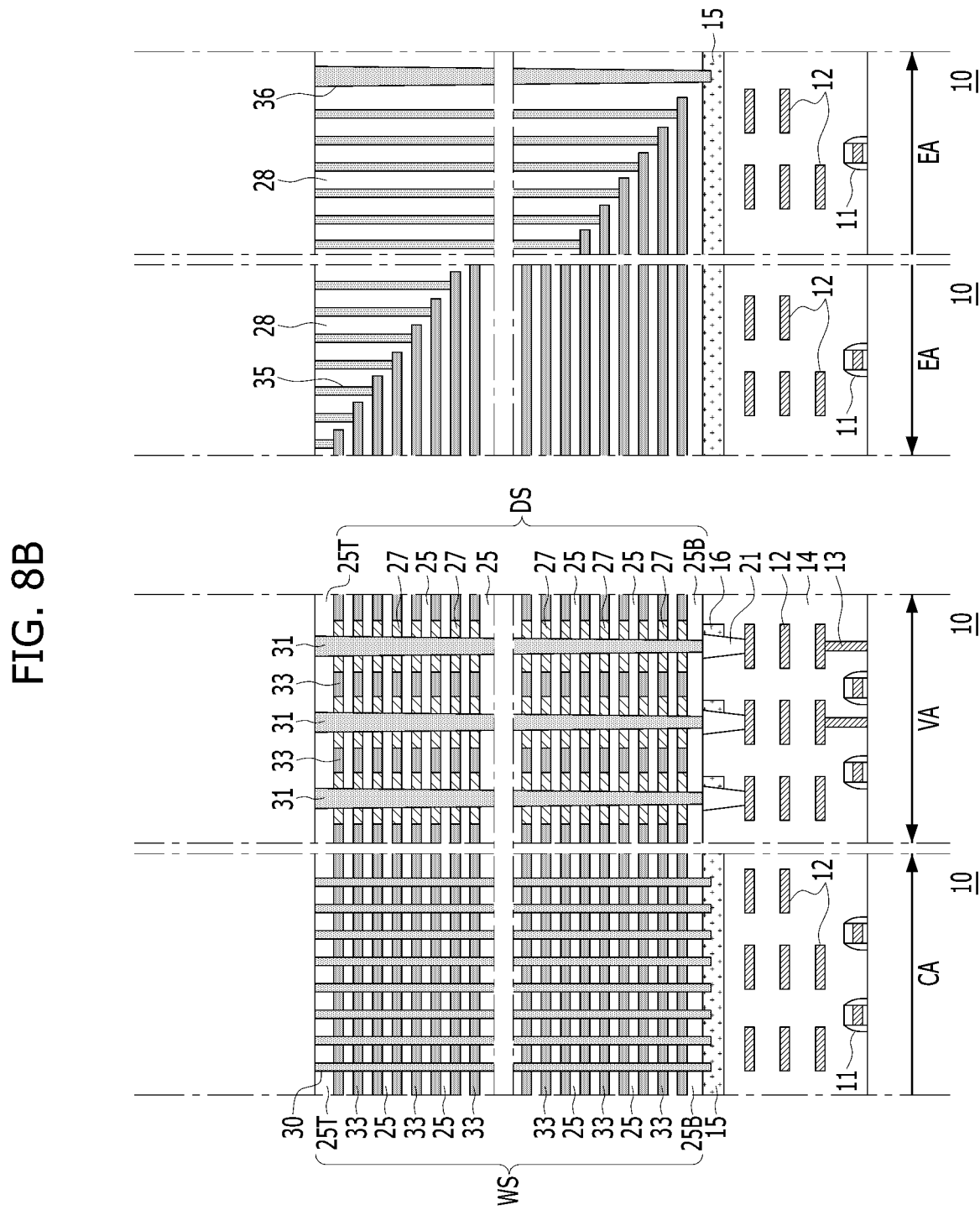

FIGS. 8A and 8B are diagrams illustrating a method of manufacturing a 3D semiconductor device in accordance with an embodiment of the present disclosure. Referring to FIG. 8A, a method of manufacturing a 3D semiconductor device may include performing the processes described with reference to FIGS. 4A to 4H and 7A to partially remove word lines 33 through via holes 31H to form spaces S in a via area VA between the cell area CA and the extension area EA. For example, portions of the word lines 33 may remain between the via holes 31H.

Referring to FIG. 8B, the method may further include forming a third insulating layer 27 in the spaces S through the via holes 31H.

Referring to FIG. 3B, the method may further include successively forming an upper insulating layer 29, vertical channel studs 40, word line contact studs 45, through via studs 46, and via studs 41. Elements and processes not described in detail may be understood with reference to other drawings.

Figure 9A:
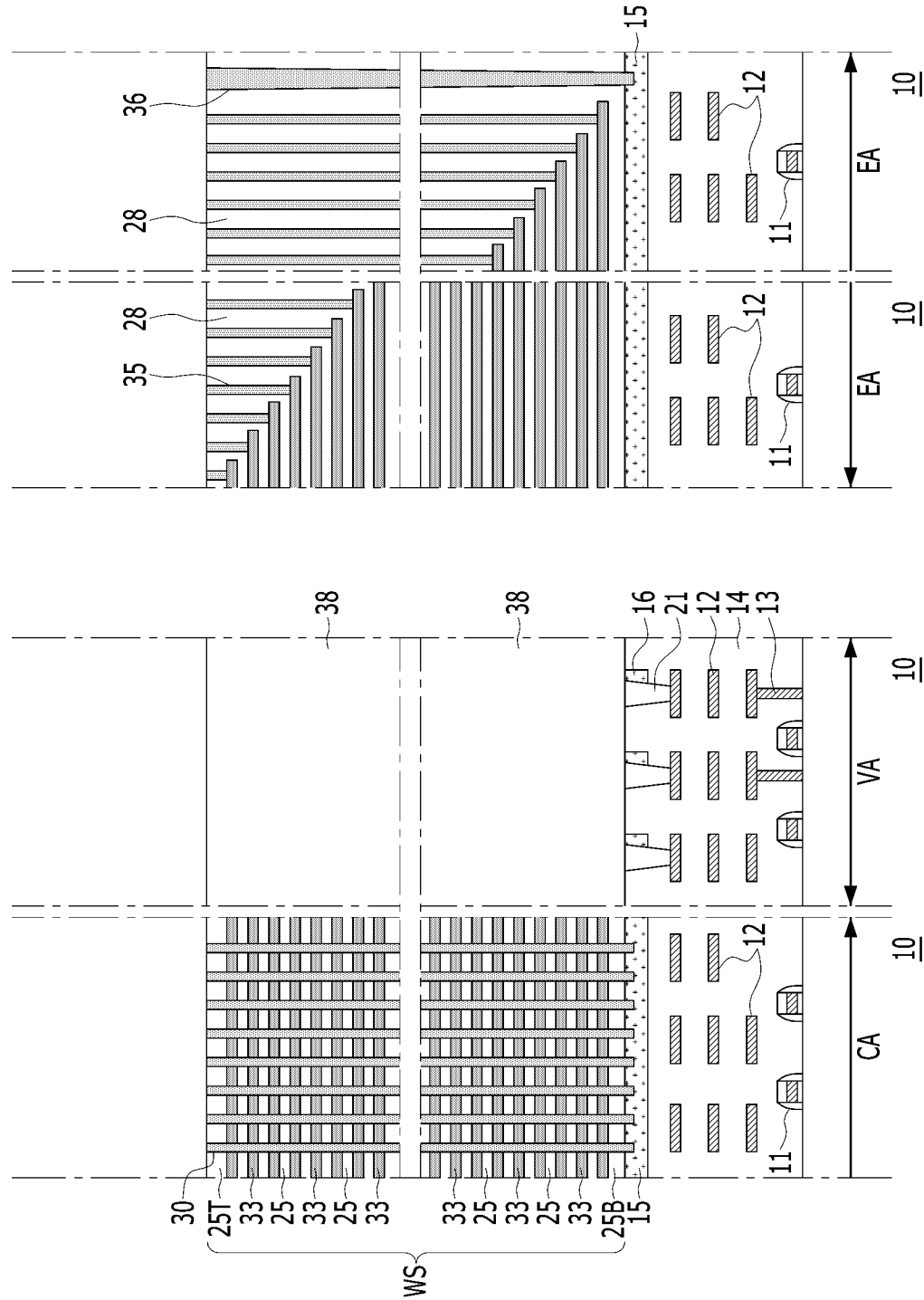
Figure 9B:
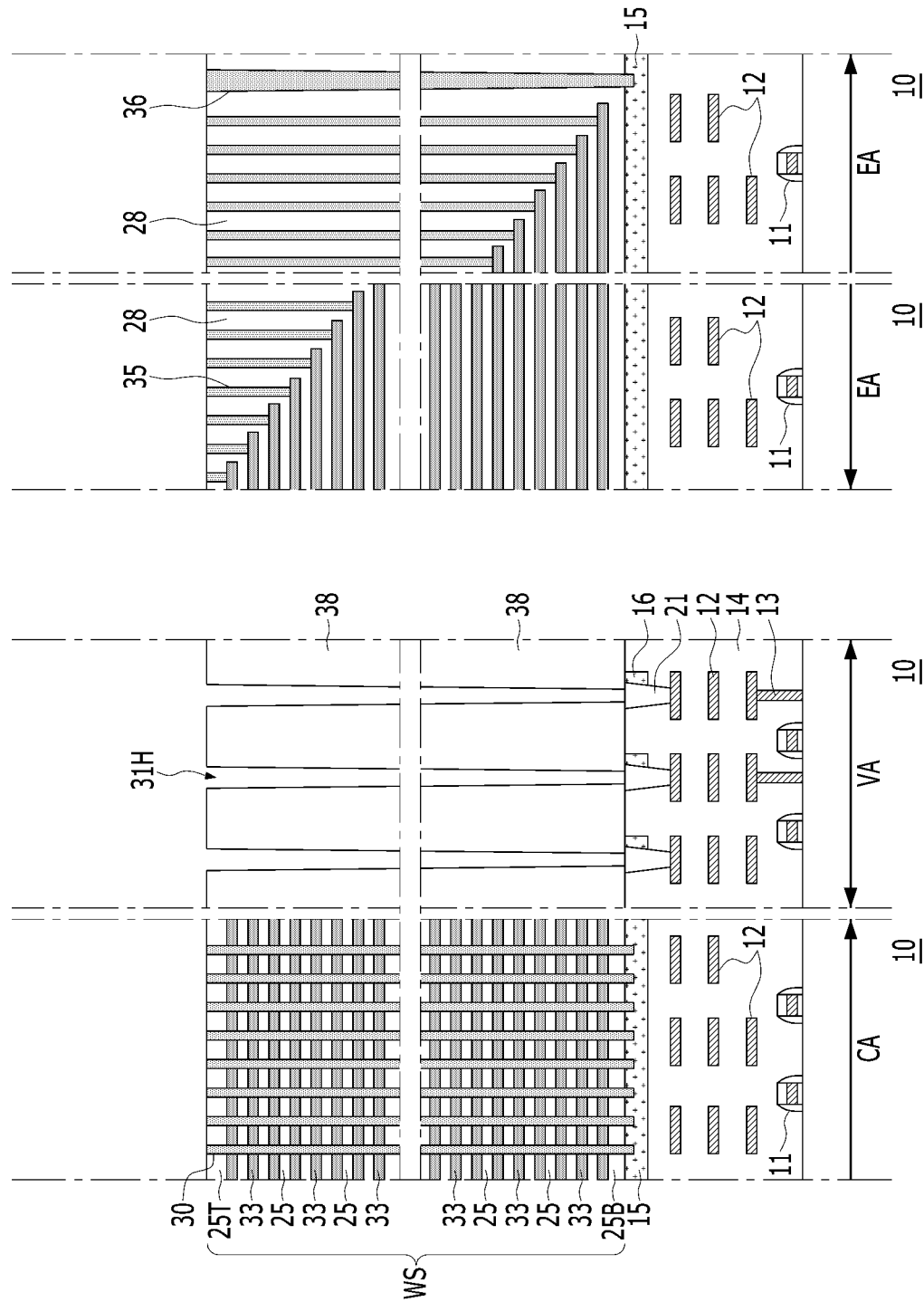
Figure 9C:
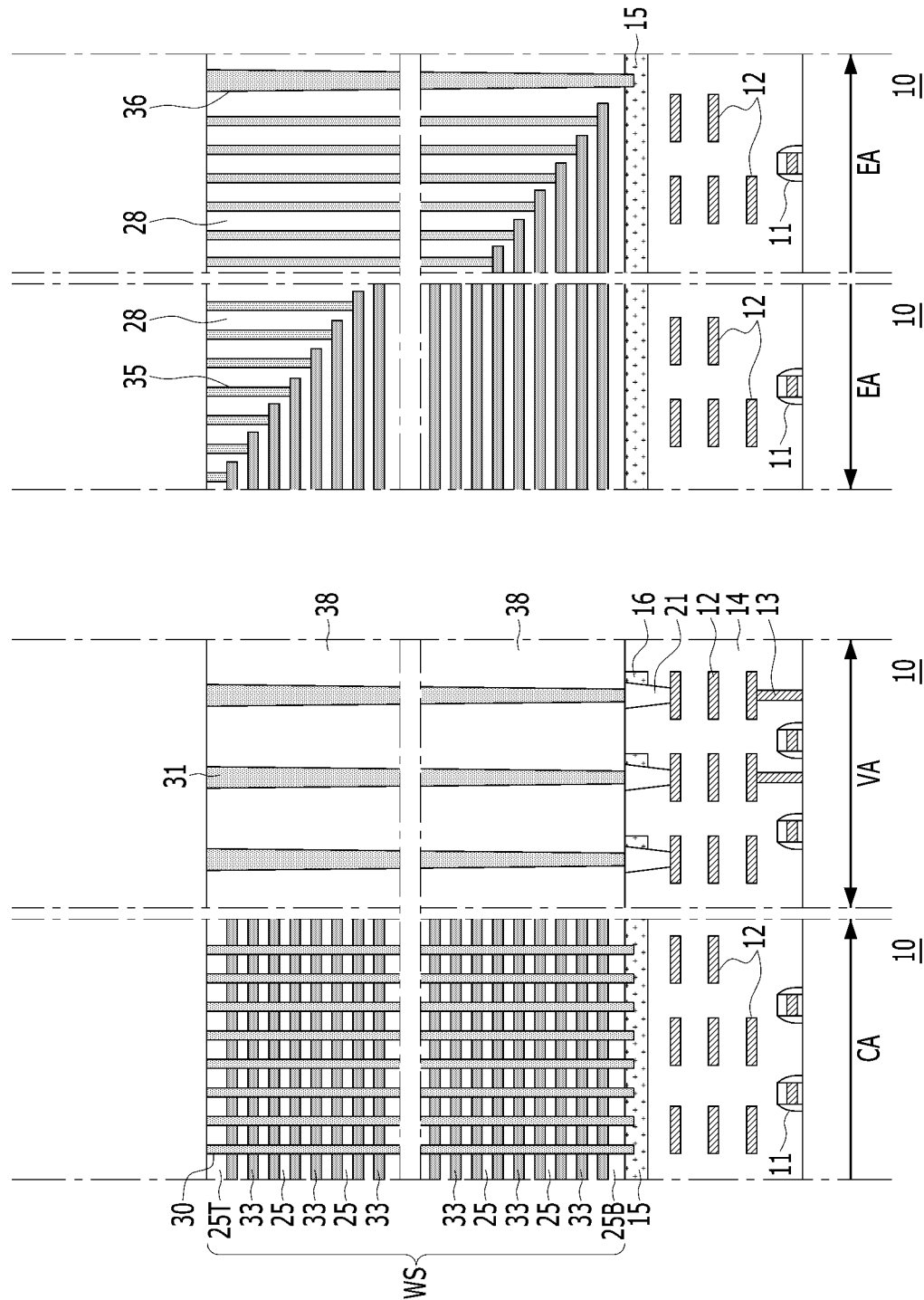

FIGS. 9A to 9C are diagrams illustrating a method of manufacturing a 3D semiconductor device in accordance with an embodiment of the present disclosure.

Referring to FIG. 9A, a method of manufacturing a 3D semiconductor device may include performing the processes described with reference to FIGS. 4A to 4H, removing the word line stack WS, and filling the spaces from which the word line stack WS is removed with a gap-fill insulating layer 38 in the via region VA.

Referring to FIG. 9B, the method may further include forming via holes 31H vertically penetrating the gap-fill insulating layer 38 to expose surfaces of the lower via plugs 21.

Referring to FIG. 9C, the method may further include forming upper via plugs 31 that fill the via holes 31H.

Referring to FIG. 3C, the method may further include successively forming an upper insulating layer 29, vertical channel studs 40, word line contact studs 45, through via studs 46, and via studs 41. Elements and processes not described in detail may be understood with reference to other drawings.

Figure 10:
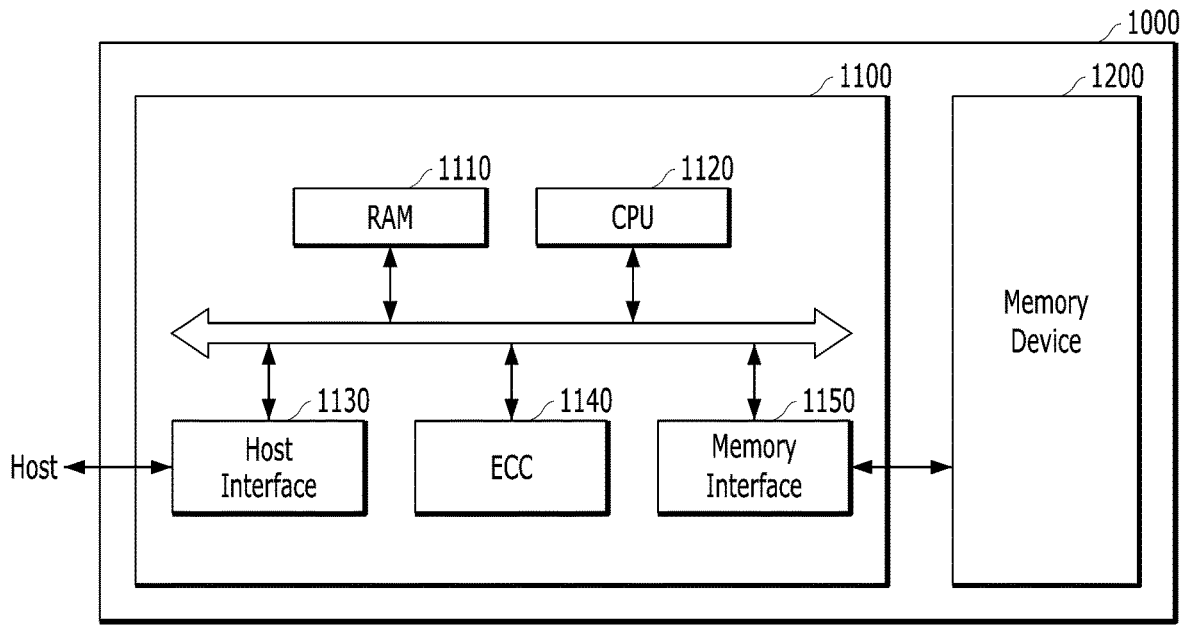
FIGS. 10 and 11 are block diagrams illustrating configurations of memory systems in accordance with embodiments of the present disclosure.

FIG. 10 is a block diagram illustrating a configuration of a memory system in accordance with an embodiment of the present disclosure. Referring FIG. 10, a memory system 1000 may include a memory device 1200 and a controller 1100. The memory device 1200 may be used to store data information having a variety of data forms such as text, graphics, and software codes. The memory device 1200 may be a nonvolatile memory. Furthermore, the memory device 1200 may include at least one of the 3D semiconductor devices 100A-100E shown in FIGS. 1A, 2A, and 3A to 3C. The controller 1100 may be coupled to a host Host and the memory device 1200. The controller 1100 may access the memory device 1200 in response to a request from the host Host. For example, the controller 1100 may control read, write, erase, and background operations of the memory device 1200. The controller may include at least one of a random access memory (RAM) 1110, a central processing unit (CPU) 1120, a host interface 1130, an error correction code (ECC) circuit 1140, and a memory interface 1150. The RAM 1110 may be used as an operation memory of the CPU 1120, a cache memory between the memory device 1200 and the host Host, a buffer memory between the memory device 1200 and the host Host, and so forth. For reference, the RAM 1110 may be replaced with a static random access memory (SRAM), a read only memory (ROM), or the like. The CPU 1120 may control overall operations of the controller 1100. For example, the CPU 1120 may operate firmware such as a flash translation layer (FTL) stored in the RAM 1110. The host interface 1130 may interface with the host Host. For example, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol a serial-ATA protocol, a parallel-ATA protocol, a small computer small interface (SCSI) protocol, an enhanced small disk interface (ESDI) protocol, and an integrated drive electronics (IDE) protocol, a private protocol, and the like. The ECC circuit 1140 may use an error correction code (ECC) to detect and correct errors in data read from the memory device 1200. The memory interface 1150 may interface with the memory device 1200. For example, the memory interface 1150 may include a NAND interface or a NOR interface. For example, the controller 1100 may further include a buffer memory (not shown) for temporarily storing data. The buffer memory may be used to temporarily store data to be transferred from the host interface 1130 to an external device or data to be transferred from the memory interface 1150 to the memory device 1200. In addition, the controller 1100 may further include a ROM that stores code data for interfacing with the host Host. Since the memory system 1000 according to the present embodiment may include the memory device 1200 having improved integration and characteristics resulting from embodiments of the disclosure, the integration, and characteristics of the memory system 1000 may also be improved.

Figure 11:
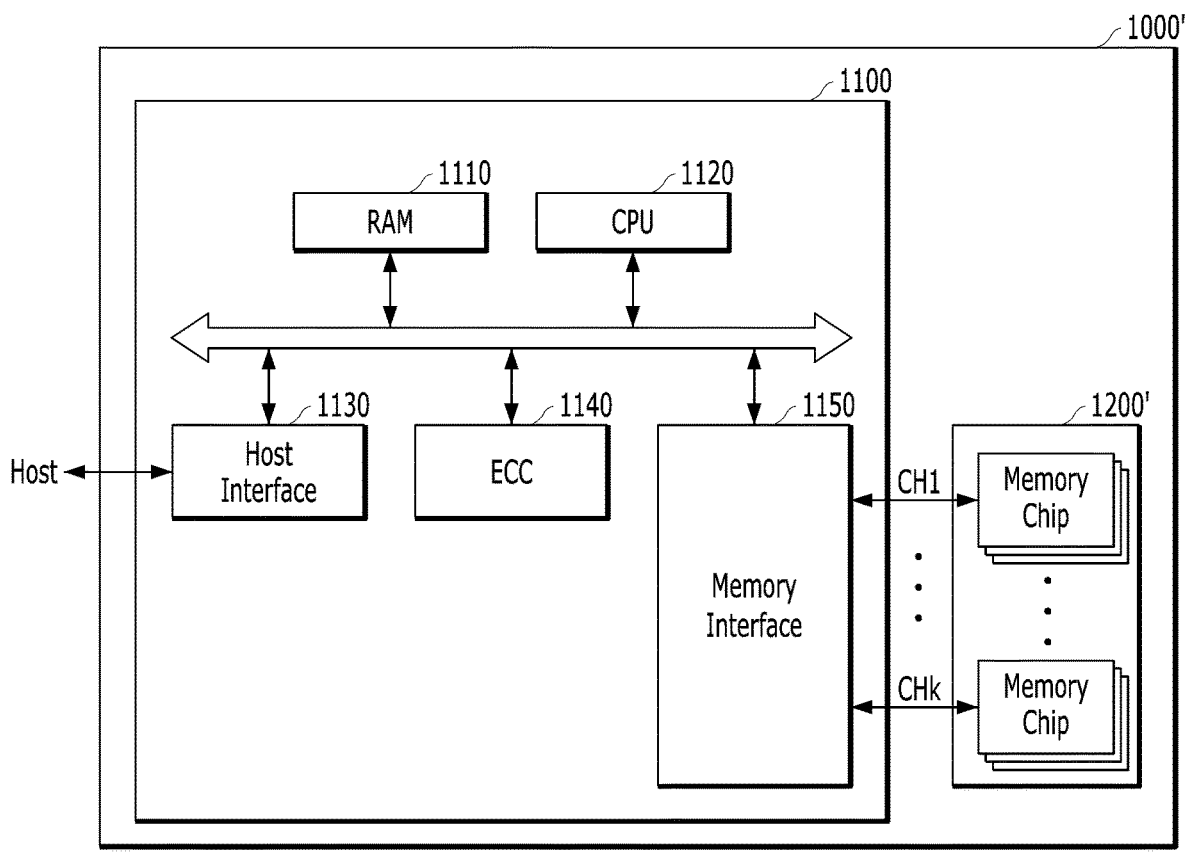

FIG. 11 is a block diagram illustrating a configuration of a memory system according to an embodiment of the present disclosure. Hereinafter, repetitive explanation will be omitted if deemed redundant. Referring to FIG. 11, a memory system 1000' according to an embodiment may include a memory device 1200' and a controller 1100. Furthermore, the controller 1100 may include a RAM 1110, a CPU 1120, a host interface 1130, an ECC circuit 1140, a memory interface 1150 and so on. The memory device 1200' may include a nonvolatile memory. Furthermore, the memory device 1200' may have the 3D semiconductor devices 100A-100E shown in FIGS. 1A, 2A, and 3A to 3C. In addition, the memory device 1200' may include a multi-chip package having a plurality of memory chips. The plurality of memory devices are divided into a plurality of groups. The plurality of groups may communicate with the controller 1100 through first to k-th channels CH1 to CHk (where k is an integer). The memory chips of each group communicate with the controller 1100 through a common channel. For reference, the memory system 1000' may be modified such that each single memory chip is coupled to a corresponding single channel. As described above, since the memory system 1000' according to the embodiment may include the memory device 1200' having improved integration and characteristics resulting from embodiments of the disclosure, the integration, and characteristics of the memory system 1000' may also be improved. In particular, the memory device 1200' may include the multi-chip package, whereby the data storage capacity and the operating speed thereof can be enhanced.

Figure 12:
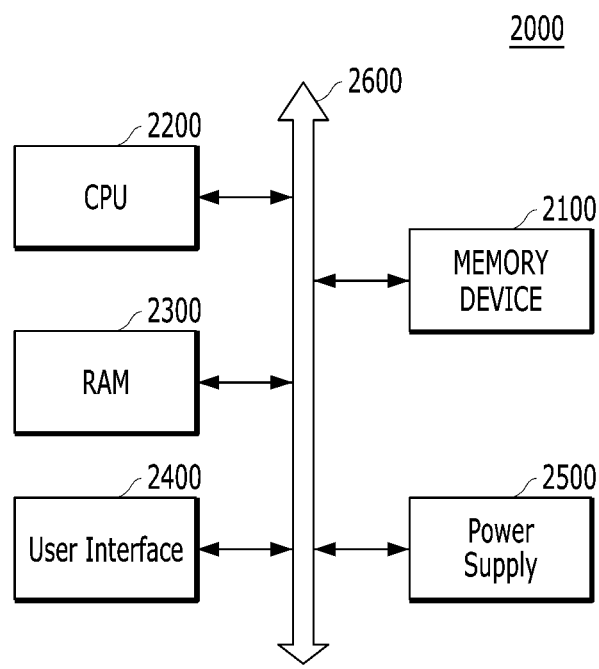
FIGS. 12 and 13 are block diagrams illustrating configurations of computing systems according to embodiments of the present disclosure.

FIG. 12 is a block diagram illustrating a configuration of a computing system according to an embodiment of the present disclosure. Hereinafter, repetitive explanation will be omitted if deemed redundant. Referring to FIG. 12, a computing system 2000 according to an embodiment of the present disclosure may include a memory device 2100, a CPU 2200, a RAM 2300, a user interface 2400, a power supply 2500, a system bus 2600, and so forth. The memory device 2100 stores data provided via the user interface 2400, data processed by the CPU 2200, etc. Furthermore, the memory device 2100 may be electrically coupled to the CPU 2200, the RAM 2300, the user interface 2400, the power supply 2500, etc. by the system bus 2600. For example, the memory device 2100 may be connected to the system bus 2600 through a controller (not shown) or directly connected to the system bus 2600. In the case where the memory device 2100 is directly coupled to the system bus 2600, the function of the controller may be performed by the CPU 2200, the RAM 2300, etc. The memory device 2100 may include a nonvolatile memory. The memory device 2100 may include at least one of the 3D semiconductor devices 100A-100E shown in FIGS. 1A, 2A, and 3A to 3C. Furthermore, the memory device 2100 may include the multi-chip package including a plurality of memory chips described in reference to FIG. 11. The computing system 2000 may include one of a computer, an ultra-mobile PC (UMPC), a workstation, a netbook, a personal digital assistance (PDA), a portable computer, a web tablet, a wireless phone, a mobile phone, a smart phone, an e-book, a portable multimedia player (PMP), a portable gaming device, a navigation device, a black box, a digital camera, a 3D television, a digital audio recorder, a digital audio player, a digital picture recorder, a digital picture player, a digital video recorder, a digital video player, a device in capable to transmit and receive information in a wireless environment, one of various electronic devices composing a home network, a computer network, or a telematics network, or an RFID deice. As described above, since the computing system 2000 according to the embodiment includes the memory device 2100 having improved integration and characteristics resulting from embodiments of the disclosure, the characteristics of the computing system 2000 may also be improved.

Figure 13:
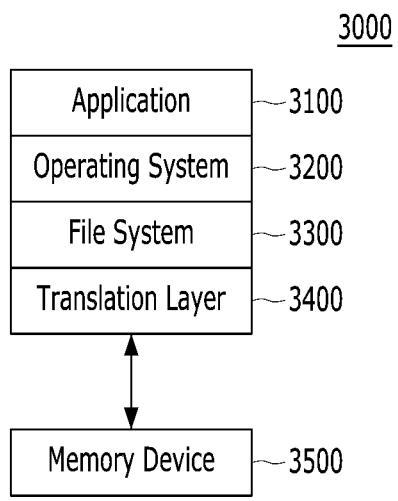

FIG. 13 is a block diagram illustrating a computing system according to an embodiment of the present disclosure. Referring to FIG. 13, a computing system 3000 according to an embodiment of the present disclosure may include a software layer, which has an operating system 3200, an application 3100, a file system 3300, a translation layer 3400, and so forth. Furthermore, the computing system 3000 may include a hardware layer such as a memory device 3500. The operating system 3200 may manage software resources and hardware resources, etc. of the computing system 3000 and may control program execution by the CPU. The application 3100 may be various application programs executed in the computing system 3000 and may be a utility executed by the operating system 3200. The file system 3300 may refer to a logical structure for controlling data, files, etc. which are present in the computing system 3000 and may organize files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like. Although the operating system 3200, the application 3100, and the file system 3300 are expressed by separate blocks in the drawing, the application 3100 and the file system 3300 may be included in the operating system 3200. The translation layer 3400 may translate an address into a suitable form for the memory device 3500 in response to a request from the file system 3300. For example, the translation layer 3400 may translate a logical address produced by the file system 3300 into a physical address of the memory device 3500. Mapping information of the logical address and the physical address may be stored in an address translation table. For example, the translation layer 3400 may be a flash translation layer (FTL), a universal flash storage link layer (ULL), or the like. The memory device 3500 may be a nonvolatile memory. Furthermore, the memory device 3500 may include at least one of the 3D semiconductor devices 100A-100E shown in FIGS. 1A, 2A, and 3A to 3C. As described above, since the computing system 3000 according to the present embodiment may include the memory device 3500 having improved integration and characteristics resulting from embodiments of the disclosure, the characteristics of the computing system 3000 may also be improved.

In accordance with the embodiments of the present disclosure, the performance of semiconductor devices can be improved because the support patterns can prevent a dishing phenomenon occurring in the CMP process and increase the alignment margin of contact plugs.

While this disclosure contains many specifics, these should not be construed as limitations on the scope of the present teachings or of what may be claimed, but rather as descriptions of features that may be specific to particular embodiments of the present teachings. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments. Only a few embodiments and examples are described. Other embodiments, enhancements, and variations can be made based on what is described and illustrated in this patent document.

What is claimed is:

1. A semiconductor device comprising:
   a substrate having a cell area and a via area;
   a transistor and a logic interconnection disposed over the substrate;
   a lower insulating layer covering the transistor and the logic interconnection;
   a common source region on the lower insulating layer in the cell area;
   a support pattern disposed on the lower insulating layer in the via area;
   a lower via plug having a side surface in contact with the support pattern and a bottom surface in contact with the logic interconnection in the via area;
   a word line stack disposed on the common source region in the cell area;
   a dielectric layer stack disposed on the support pattern and the lower insulating layer in the via area;
   a plurality of vertical channel pillar penetrating the word line stack to be commonly connected to the common source region in the cell area;
   an upper via plug penetrating the dielectric layer stack to be aligned in a vertical direction with the lower via plug in the via area,
   wherein the support pattern is a conductor; and
   wherein the semiconductor device further comprises:
   a plurality of support patterns arranged to be spaced apart from each other in a horizontal direction by a portion of the lower insulating layer,
   a plurality of lower via plugs, each of the plurality of lower via plugs in directly contact with each of the plurality of support patterns, respectively; and
   wherein the support pattern has a pair of segments shaped to contact at least two side surfaces of the lower via plug having a plurality of side surfaces.

2. The semiconductor device of claim 1,
   wherein each of the common source region and the support pattern includes a polysilicon layer doped with N-type ions.

3. The semiconductor device of claim 1,
   wherein the common source region and the support pattern are disposed at a same level in the vertical direction.

4. The semiconductor device of claim 1,
   wherein the common source region and the support pattern have the same thickness in the vertical direction.

5. The semiconductor device of claim 1,
   wherein the lower via plug has a greater thickness than the support pattern in the vertical direction.

6. The semiconductor device of claim 1,
   wherein the common source region has a plate shape occupying most of the cell area.

7. The semiconductor device of claim 1,
   wherein top surfaces of the common source region, the support pattern, the lower via plug, and the lower insulating layer are co-planar.

8. The semiconductor device of claim 1,
   wherein the support pattern has a frame shape, in a top view, that surrounds the side surface of the lower via plug.

9. The semiconductor device of claim 1, further comprising:
   an extension area and word line contact plugs disposed in the extension area,
   wherein:
   the word line contact plugs are connected to end portions of the word lines in the extension area,
   the word line stack and the common source region extend toward the via area,
   the word line contact plugs are not in contact with the common source region.

10. The semiconductor device of claim 9, further comprising:
    a through via plug connected to the common source region in the extension area,
    wherein the through via plug is not in contact with the word lines of the word line stack.

11. The semiconductor device of claim 9,
    wherein the extension area is disposed between the cell area and the via area.

12. A semiconductor device comprising:
    a logic device layer and a memory device layer stacked on the logic device layer,
    wherein the logic device layer comprises:
    a substrate having a cell area and a via area;
    a logic interconnection disposed over the substrate;
    a common source region disposed over the logic interconnection in the cell area;
    a lower via plug in contact with the logic interconnection in the via area; and
    a support pattern in contact with a side surface of the lower via plug in the via area,
    wherein the memory device layer comprises:
    a word line stack disposed on the common source region in the cell area, the word line stack including first insulating layers and word lines alternately stacked;

a plurality of vertical channel pillars penetrating the word line stack in a vertical direction to be commonly connected to the common source region in the cell area;

a dielectric layer stack in the via area;

an upper peripheral contact plug vertically penetrating the dielectric layer stack to be vertically aligned with the lower via plug in the via area, wherein top surfaces of the lower via plug and the support pattern are co-planar, wherein the lower via plug has a height greater than that of the support pattern in the vertical direction, and wherein the support pattern is a conductor; and wherein the semiconductor device further comprises:

a plurality of support patterns arranged to be spaced apart from each other in a horizontal direction by a portion of the lower insulating layer, a plurality of lower via plugs, each of the plurality of lower via plugs in directly contact with each of the plurality of support patterns, respectively; and wherein the support pattern has a pair of segments shaped to contact at least two side surfaces of the lower via plug having a plurality of side surfaces.

13. The semiconductor device of claim 12, wherein:

the dielectric layer stack includes the first insulating layers and second insulating layers alternately stacked, and the first insulating layers and the second insulating layers have an etch selectivity to each other.

14. A semiconductor device comprising:

a substrate having a cell area, an extension area, and a via area;

a transistor and a logic interconnection disposed over the substrate;

a common source region disposed over the transistor and the logic interconnection in the cell area and the extension area;

a support pattern and a lower via plug disposed on a lower insulating layer in the via area;

a word line stack disposed on the common source region in the cell area and the extension area;

a plurality of vertical channel pillars vertically penetrating the word line stack to be commonly connected to the common source region in the cell area;

word line contact plugs electrically connected to the word lines of the word line stack in the extension area, respectively;

a dielectric layer stack disposed on the support pattern, the lower via plug and the lower insulating layer in the via area;

an upper via plug vertically penetrating the dielectric layer stack to be vertically aligned with the lower via plug, wherein a side surface of the support pattern and a side surface of the lower via plug are in contact with each other, wherein the support pattern is a conductor; and wherein the semiconductor device further comprises:

a plurality of support patterns arranged to be spaced apart from each other in a horizontal direction by a portion of the lower insulating layer, a plurality of lower via plugs, each of the plurality of lower via plugs in directly contact with each of the plurality of support patterns, respectively; and wherein the support pattern has a pair of segments shaped to contact at least two side surfaces of the lower via plug having a plurality of side surfaces.

* * * * *